United States Patent
Takeuchi et al.

(10) Patent No.: US 7,411,830 B2
(45) Date of Patent: Aug. 12, 2008

(54) NONVOLATILE MEMORY CELL HAVING CURRENT COMPENSATED FOR TEMPERATURE DEPENDENCY AND DATA READ METHOD THEREOF

(75) Inventors: Ken Takeuchi, Kawasaki (JP); Takuya Futatsuyama, Yokohama (JP); Koichi Kawai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/531,082

(22) Filed: Sep. 12, 2006

(65) Prior Publication Data

US 2007/0036016 A1 Feb. 15, 2007

Related U.S. Application Data

(63) Continuation of application No. PCT/IB2005/002923, filed on Sep. 30, 2005.

(30) Foreign Application Priority Data

Jan. 13, 2005 (JP) .............................. 2005-006432

(51) Int. Cl.
G11C 11/34 (2006.01)
(52) U.S. Cl. .................. 365/185.18; 365/211
(58) Field of Classification Search ............ 365/185.18, 365/211
See application file for complete search history.

(56) References Cited

U.S. PATENT DOCUMENTS

| 6,452,437 | B1 | 9/2002 | Takeuchi et al. | |
|---|---|---|---|---|
| 2002/0109539 | A1 | 8/2002 | Takeuchi et al. | |
| 2002/0159315 | A1 | 10/2002 | Noguchi et al. | |
| 2004/0223371 | A1 | 11/2004 | Roohparvar | |
| 2005/0157558 | A1* | 7/2005 | Noguchi et al. | 365/185.22 |
| 2005/0254302 | A1* | 11/2005 | Noguchi | 365/185.17 |

FOREIGN PATENT DOCUMENTS

| JP | 2000-11671 | 1/2000 |
|---|---|---|
| JP | 2003-217287 | 7/2003 |

* cited by examiner

*Primary Examiner*—Michael T Tran
(74) *Attorney, Agent, or Firm*—Oblon, Spivak, McClelland, Maier & Neustadt, P.C.

(57) ABSTRACT

A nonvolatile semiconductor memory device includes a memory cell array, read circuit, program circuit, read voltage generating circuit, memory circuit and switching circuit. The read voltage generating circuit generates and supplies a read voltage to the read circuit. The memory circuit stores information which changes the temperature characteristic of a memory cell in the memory cell array. The switching circuit changes the temperature dependency of read voltage generated from the read voltage generating circuit based on information stored in the memory circuit.

22 Claims, 22 Drawing Sheets

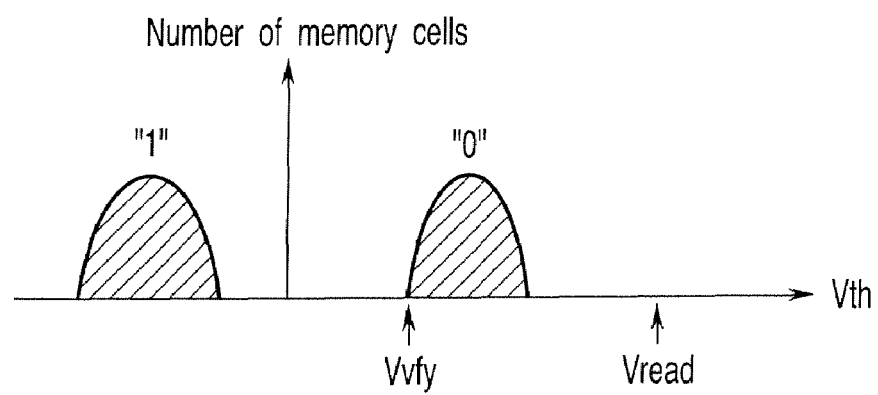
F I G. 5
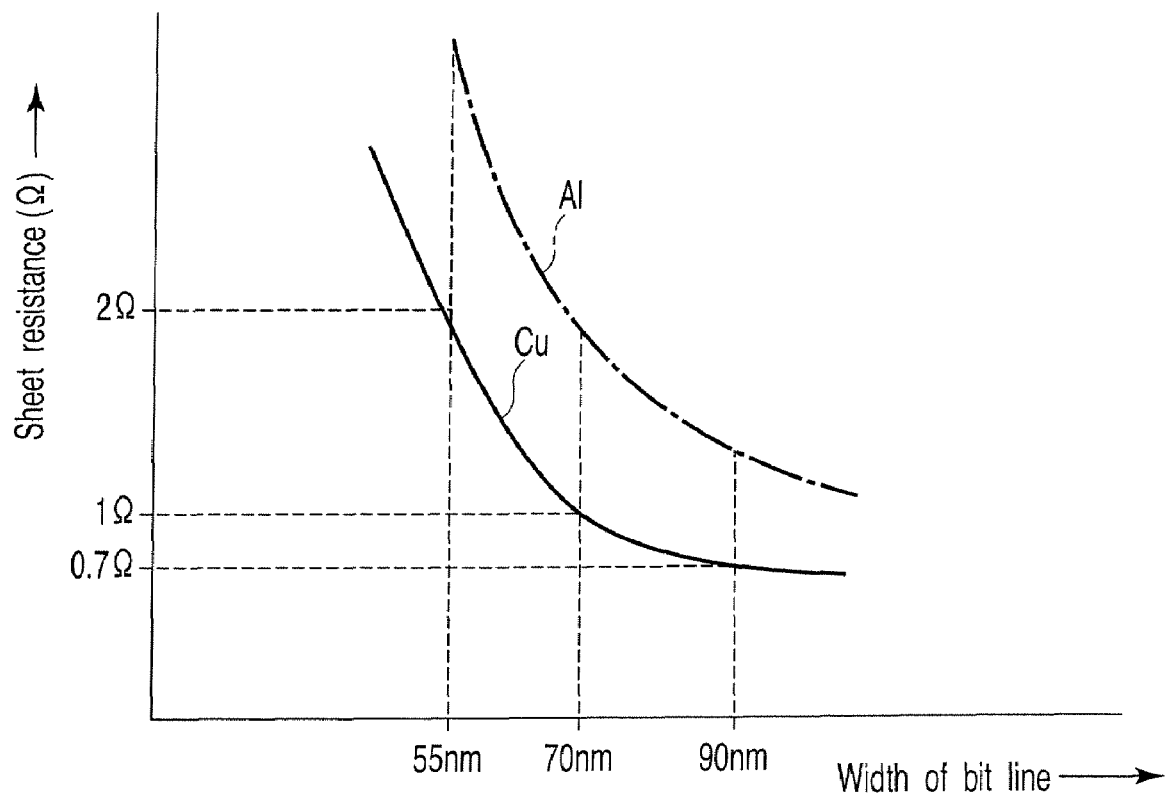
F I G. 6

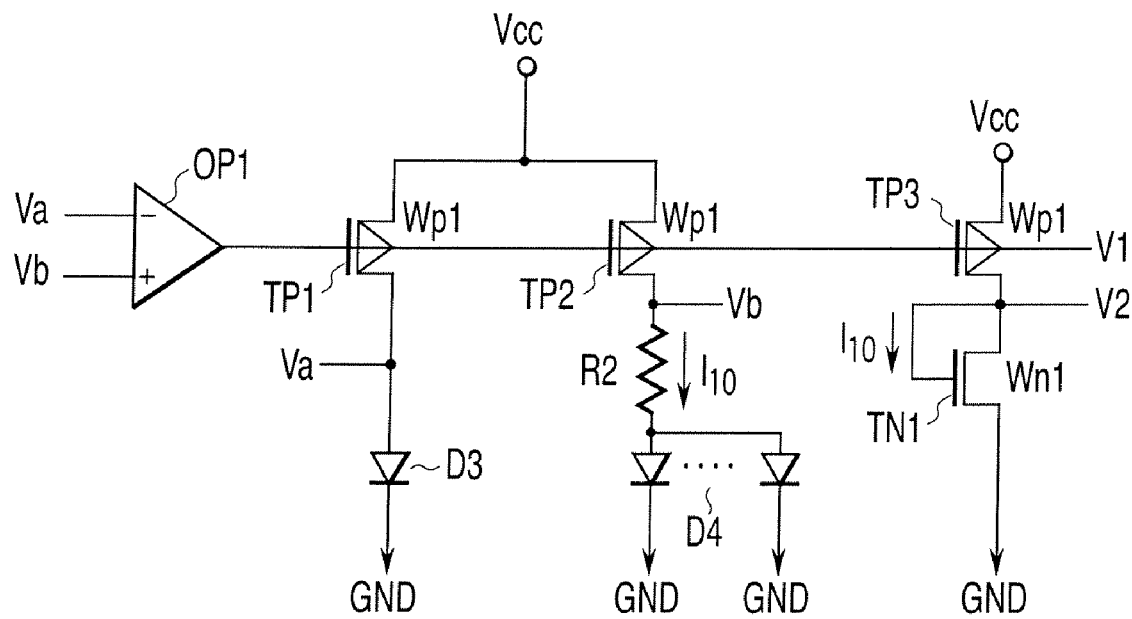
F I G. 8 A
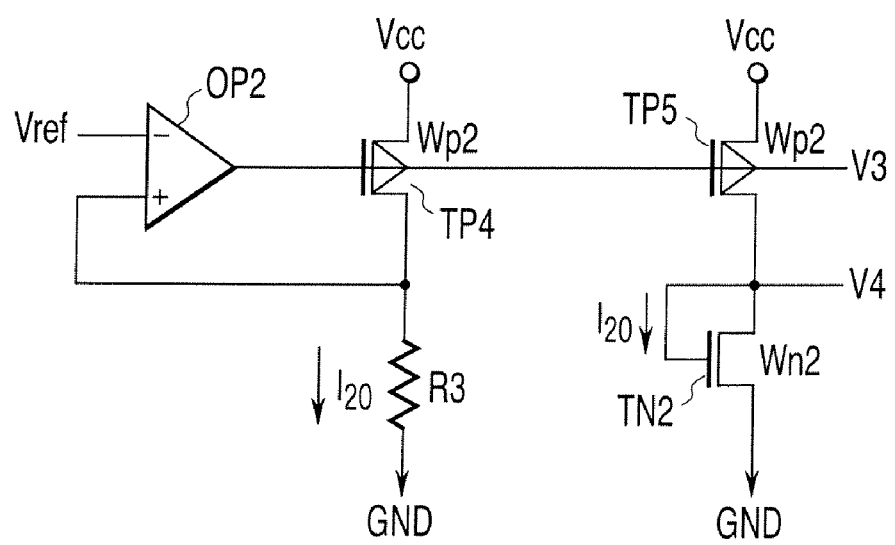
F I G. 8 B

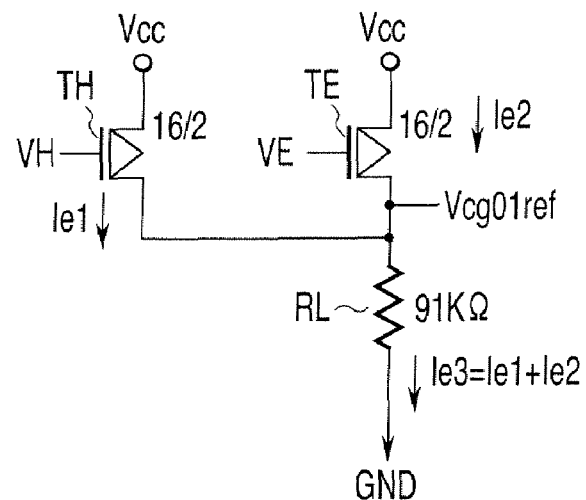
F I G. 12 A
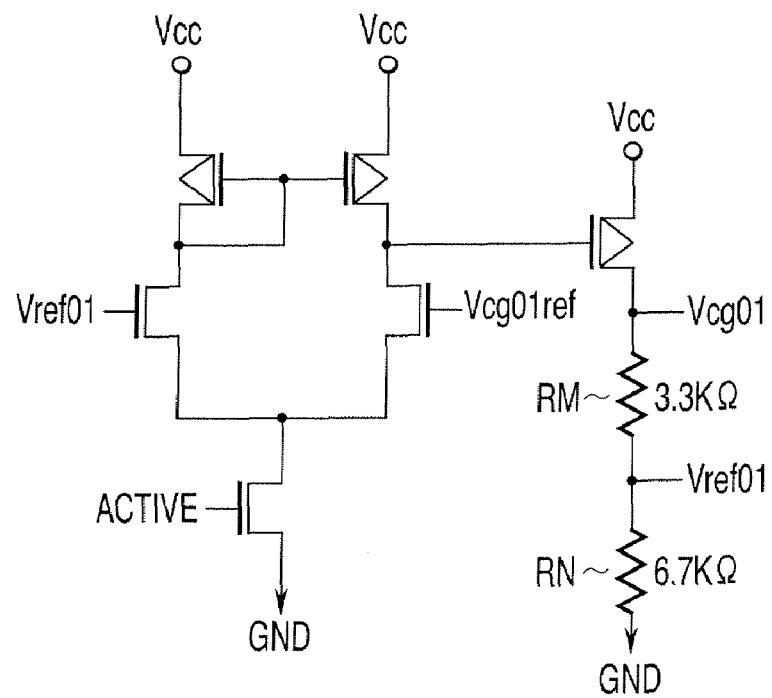
F I G. 12 B

|  | -20°C | 32.5°C | 85°C | Variation in output voltage with temperature |
|---|---|---|---|---|
| Vcg01ref | 0.92V | 0.89V | 0.85V | -67mV/100°C |
| Vcg01 | 1.37V | 1.33V | 1.28V | -100mV/100°C |
| Vcg00ref | 0.99V | 0.88V | 0.83V | -95mV/100°C |
| Vcg00 | 0.88V | 0.84V | 0.79V | -100mV/100°C |
| Vcg10ref | 1.01V | 0.86V | 0.7V | -295mV/100°C |
| Vcg10 | 0.34V | 0.29V | 0.24V | -100mV/100°C |

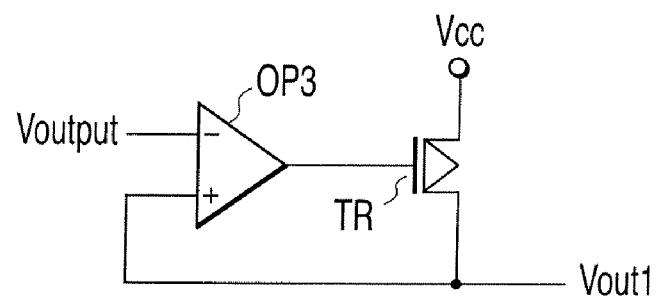
F I G. 19
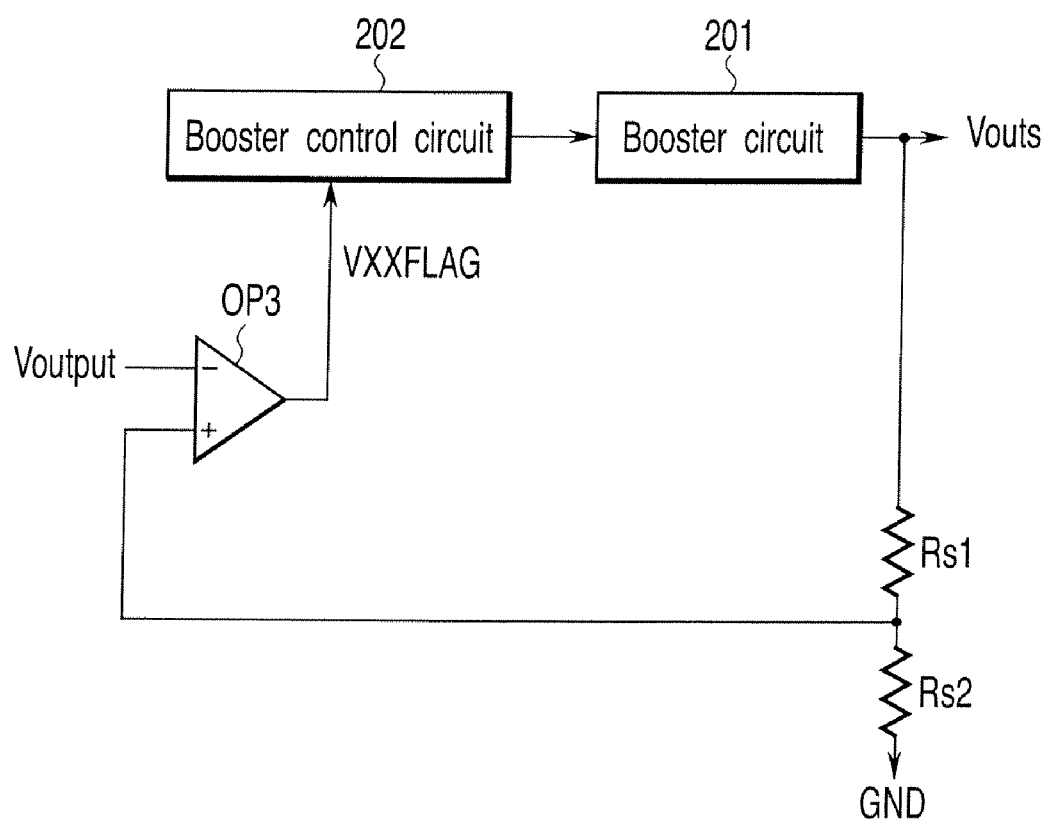
F I G. 20

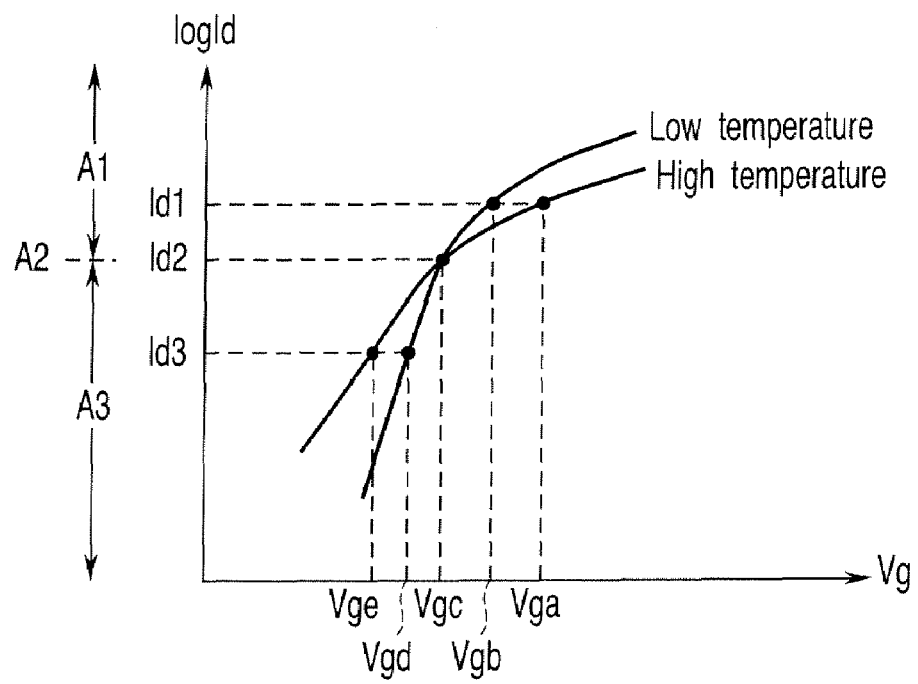
F I G. 27
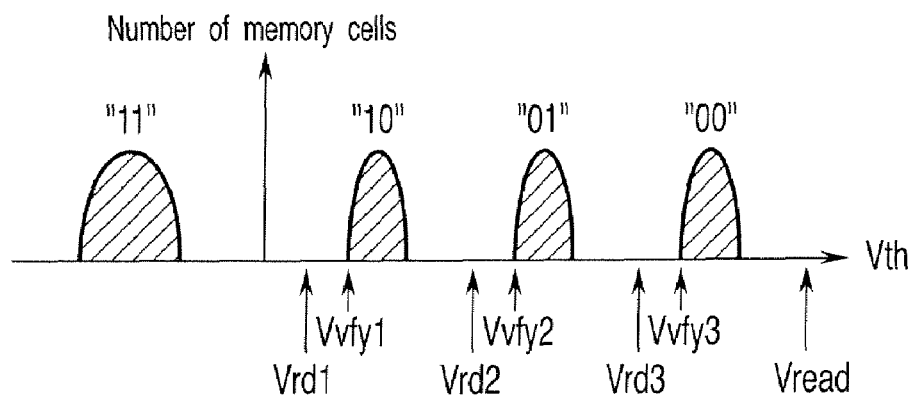
F I G. 28

NONVOLATILE MEMORY CELL HAVING CURRENT COMPENSATED FOR TEMPERATURE DEPENDENCY AND DATA READ METHOD THEREOF

CROSS-REFERENCE TO RELATED APPLICATIONS

This is a Continuation Application of PCT Application No. PCT/IB2005/002923, filed Sep. 30, 2005, which was published under PCT Article 21(2) in English.

This application is based upon and claims the benefit of priority from prior Japanese Patent Application No. 2005-006432, filed Jan. 13, 2005, the entire contents of which are incorporated herein by reference.

BACKGROUND OF THE INVENTION

1. Field of the Invention

This invention relates to an electrically rewritable nonvolatile memory and a data read method and more particularly to the technique for compensating for temperature dependency of a memory cell current.

2. Description of the Related Art

With increasing miniaturization of semiconductor integrated circuit devices, the width and thickness of wirings are becoming smaller and the wiring resistance becoming higher. For example, in a semiconductor memory device, with increasing miniaturization of the wiring, the resistance of bit lines is made higher. Generally, a sense amplifier for sensing and amplifying data read from a memory cell is connected to the bit lines. In the data read operation, a memory cell current is set to "Cb1×ΔVb1/tb1" in a portion near the sense amplifier (that is, in a portion in which the resistance of the bit line is low) if it is required to change the potential of the bit line by ΔVb1 in a preset read period tb1 and the bit line capacitance is set to Cb1. On the other hand, since the resistance of the bit line becomes higher in the end portion of the bit line which is farthest apart from the sense amplifier, a larger memory cell current is required.

Therefore, the memory cell current varies according to the distance of a portion of the bit line from the sense amplifier (the distance from a sense point). If the memory cell current varies according to the distance from the sense point, the temperature characteristic of the memory cell is changed and the threshold voltage thereof fluctuates according to temperature variation. If the threshold voltage fluctuates, the distribution of the threshold voltages spreads and the data holding characteristic thereof is degraded (for example, refer to Jpn. Pat. Appln. KOKAI Publication No. 2003-217287 and Jpn. Pat. Appln. KOKAI Publication No. 2000-011671).

Further, the semiconductor memory device will be further miniaturized in future, and it is predicted that the temperature characteristic of the memory cell varies and the threshold voltage fluctuates according to the difference in the etching rate due to the difference in the environment of the surroundings, aberration and distortion of the optical system of an exposure device caused by a difference in the pattern of peripheral portions such as regions in which the wirings are densely and coarsely arranged in a single chip or a difference in the position of a wafer, for example, the central portion or peripheral portion of the wafer in which chips of the semiconductor memory devices are formed.

Therefore, there occurs a possibility that the distribution of the threshold voltages will spread due to a difference in the position of the memory cells in the chip or a difference between the chips and the data holding characteristic is deteriorated.

BRIEF SUMMARY OF THE INVENTION

According to an aspect of the present invention, there is provided a nonvolatile semiconductor memory device comprising a memory cell array having memory cells arranged in a matrix form, a read circuit configured to read data from the memory cell in the memory cell array, a program circuit configured to program data into the memory cell in the memory cell array, a read voltage generating circuit configured to generate and supply read voltage to the read circuit, a memory circuit configured to store information used to change the temperature characteristic of the memory cell in the memory cell array, and a switching circuit configured to switch the temperature dependency of the read voltage generated by the read voltage generating circuit based on information stored in the memory circuit.

According to another aspect of the present invention, there is provided a data read method of a nonvolatile semiconductor memory device comprising storing information used to change the temperature characteristic of a memory cell in a memory cell array, setting read voltage based on the stored information used to change the temperature characteristic when a memory cell which is subjected to a read operation is accessed, and changing the temperature characteristic of the threshold voltage of the memory cell based on the set read voltage and reading out data.

BRIEF DESCRIPTION OF THE SEVERAL VIEWS OF THE DRAWING

FIG. 5 is a diagram for illustrating the distributions of the threshold voltages of NAND cells;

FIG. 6 is a diagram for illustrating the relation between the resistance (sheet resistance) of a bit line and the design rule (the width of the bit line);

FIG. 8A is a circuit diagram showing a concrete configuration example of the circuit shown in FIG. 7 and showing a current generating circuit which generates a current varying in proportion to a temperature;

FIG. 8B is a circuit diagram showing a concrete configuration example of the circuit shown in FIG. 7 and showing a constant current generating circuit which generates a current which is independent of a temperature;

FIG. 12A is a diagram showing a current adding/subtracting circuit which adds/subtracts a constant current which is generated by the circuit of FIG. 11A and is independent of the temperature and a current which is generated by the circuit of FIG. 11B and decreases with the temperature rise to or from each other, for illustrating a case wherein various voltages having the same temperature dependency are generated;

FIG. 12B is a diagram showing a DC-DC converting circuit which adds/subtracts a constant current which is generated by the circuit of FIG. 11A and is independent of the temperature and a current which is generated by the circuit of FIG. 11B and decreases with the temperature rise to or from each other, for illustrating a case wherein various voltages having the same temperature dependency are generated;

FIG. 19 is a circuit diagram showing a modification of the circuits shown in FIGS. 7, 10 to 14;

FIG. 20 is a circuit diagram showing another modification of the circuits shown in FIGS. 6, 10 to 14;

FIG. 27 is a diagram showing the drain current-gate voltage characteristic of a memory cell transistor; and FIG. 28 is a diagram showing the distributions of the threshold voltages of four-value memory cells.

DETAILED DESCRIPTION OF THE INVENTION

First Embodiment

Figure 1:
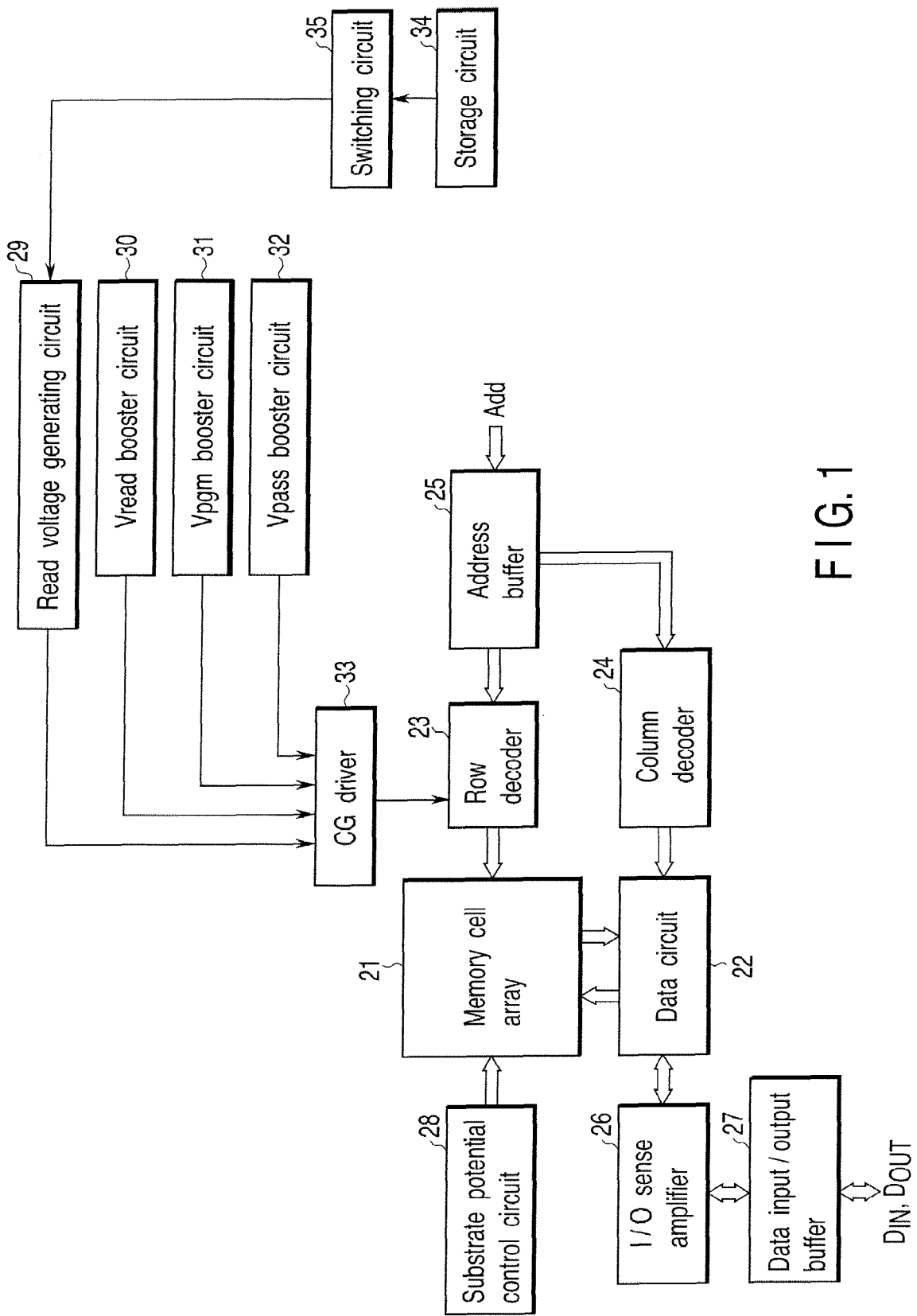
FIG. 1 is a block diagram showing the schematic configuration of a NAND cell type EEPROM, for illustrating a nonvolatile semiconductor memory device according to a first embodiment of this invention.

FIG. 1 is a block diagram showing the schematic configuration of a NAND cell type EEPROM, for illustrating a nonvolatile semiconductor memory device according to a first embodiment of this invention.

The NAND cell type EEPROM includes a memory cell array 21, data circuit 22, row decoder 23, column decoder 24, address buffer 25, I/O sense amplifier 26, data input/output buffer 27, substrate potential control circuit 28, read voltage generating circuit 29, Vread booster circuit 30, Vpgm booster circuit 31, Vpass booster circuit 32, control gate (CG) driver 33, memory circuit 34 and switching circuit 35.

In the memory cell array 21, memory cells are arranged in a matrix form. The data circuit 22 temporarily stores program data and read data. The row decoder 23 decodes a row address signal supplied from the address buffer 25 to select one of word lines provided in the memory cell array 21. The column decoder 24 decodes a column address signal supplied from the address buffer 25 to select one of bit lines provided in the memory cell array 21. The address buffer 25 is supplied with an address signal Add. The I/O sense amplifier 26 senses and amplifies data read from the memory cell in the memory cell array 21 and temporarily stored in the data circuit 22 or supplies data to be programmed into the memory cell in the memory cell array 21 to the data circuit 22. The data input/output buffer 27 supplies program data $D_{IN}$ input thereto to the I/O sense amplifier 26 or outputs read data $D_{OUT}$ sensed and amplified by the I/O sense amplifier 26. The substrate potential control circuit 28 controls the substrate potential of the memory cell array 21.

The read voltage generating circuit 29 generates read voltage applied to a selected word line at the read time. The Vread booster circuit 30 generates voltage Vread applied to non-selected word lines at the read time. The Vpgm booster circuit 31 generates voltage Vpgm applied to the selected word line at the write (program) time. The Vpass booster circuit 32 generates voltage Vpass applied to the non-selected word lines at the write time. The control gate driver (CG driver) 33 is supplied with output voltages of the read voltage generating circuit 29, Vread booster circuit 30, Vpgm booster circuit 31, Vpass booster circuit 32. The control gate driver 33 functions as a switching circuit which selectively transfers the read voltage, voltage Vread, voltage Vpgm and voltage Vpass to the word lines in the memory cell array 21 via the row decoder 21. Although not shown in the drawing, a booster circuit which generates erase voltage is also provided.

The memory circuit 34 is configured by fuse elements, for example, and information is previously programmed therein by selectively melting the fuse elements by use of laser blow or current flow. Alternatively, it can be configured by rewritable ROM fuses in which information can be rewritten by use of a signal or command supplied from the exterior or may utilize part of a storage area in the memory cell array 21. Thus, information which is used to change (compensate for) the temperature characteristics of the memory cells in the memory cell array 21 is stored in the memory circuit 34. Further, in the memory circuit 34, information items each corresponding to the distance (the wiring resistance or the wiring length of the bit line) from the sense point to the memory cell in the memory cell array 21, for example, column addresses are stored. The switching circuit 35 controls the read voltage generating circuit 29 based on information stored in the memory circuit 34 to switch the temperature dependency of the read voltage generated by the read voltage generating circuit 29.

Figure 2:
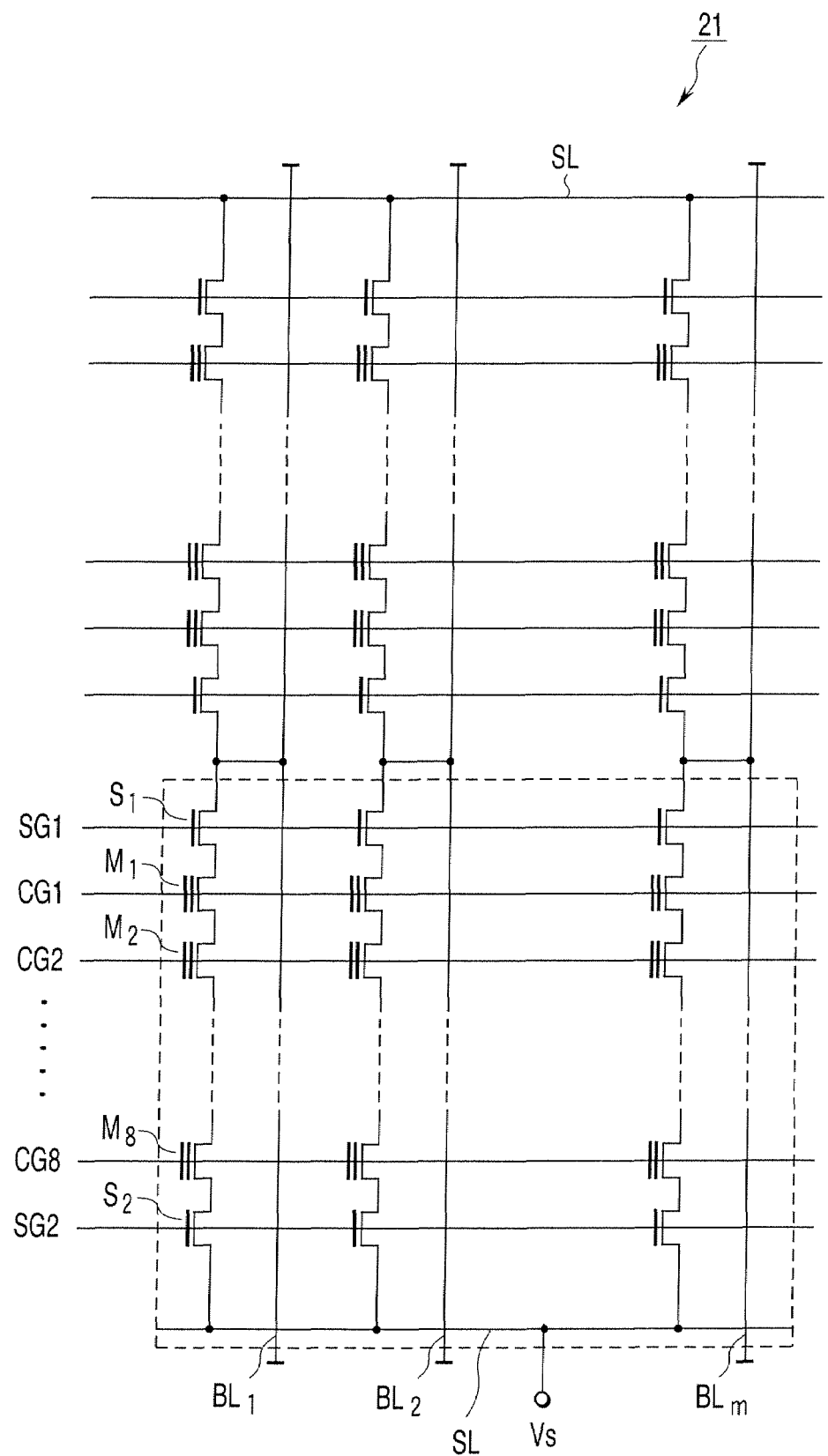
FIG. 2 is an equivalent circuit diagram of a memory cell array in the NAND cell type EEPROM shown in FIG. 1.

FIG. 2 shows an equivalent circuit of the memory cell array 21 in the NAND cell type EEPROM shown in FIG. 1.

Control gate lines CG1, CG2, . . . , CG8, selection gate lines SG1, SG2 and source lines SL are arranged in the row direction and bit lines $BL_1$, $BL_2$, . . . , $BL_m$ are arranged in the column direction. The control gates of memory cells (memory cell transistors) $M_1$, $M_2$, . . . , $M_8$ are respectively connected to the control gate lines CG1, CG2, . . . , CG8 and the gates of first and second selection transistors $S_1$, $S_2$ are respectively connected to the selection gate lines SG1, SG2. The current paths of the memory cells $M_1$, $M_2$, . . . , $M_8$ and first and second selection transistors $S_1$, $S_2$ are series-connected between the bit lines BL ($BL_1$, $BL_2$, . . . $BL_m$) and the source line SL. The source line SL is connected to a reference potential (Vs) wiring formed of aluminum (Al), polysilicon or the like via a contact in one portion for every 64 bit lines BL, for example. The reference potential wiring is connected to a peripheral circuit.

Generally, a set of memory cells Mn connected to one control gate line CGn (n=1, 2, . . . , 8) is called one page and a set of pages sandwiched between one pair of selection transistors $S_1$ and $S_2$ provided on the drain side and source side as indicated by broken lines is called one NAND block or simply one block. For example, one page is configured by 256-byte (256×8) memory cells. The memory cells of one page are substantially simultaneously programmed. One block is configured by 2048-byte (2048×8) memory cells, for example. The memory cells of one block are substantially simultaneously erased.

Figure 3A:
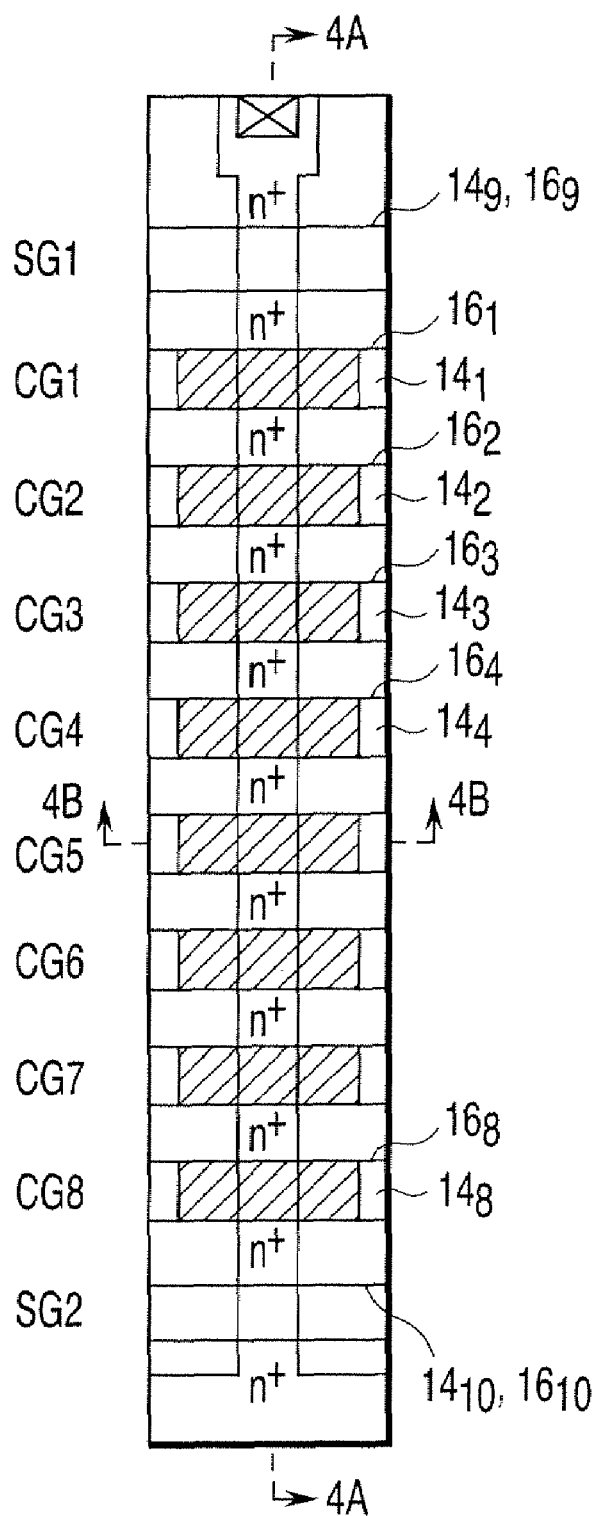
FIG. 3A is a pattern plan view showing one NAND cell portion extracted from the memory cell array in the NAND cell type EEPROM.
Figure 3B:
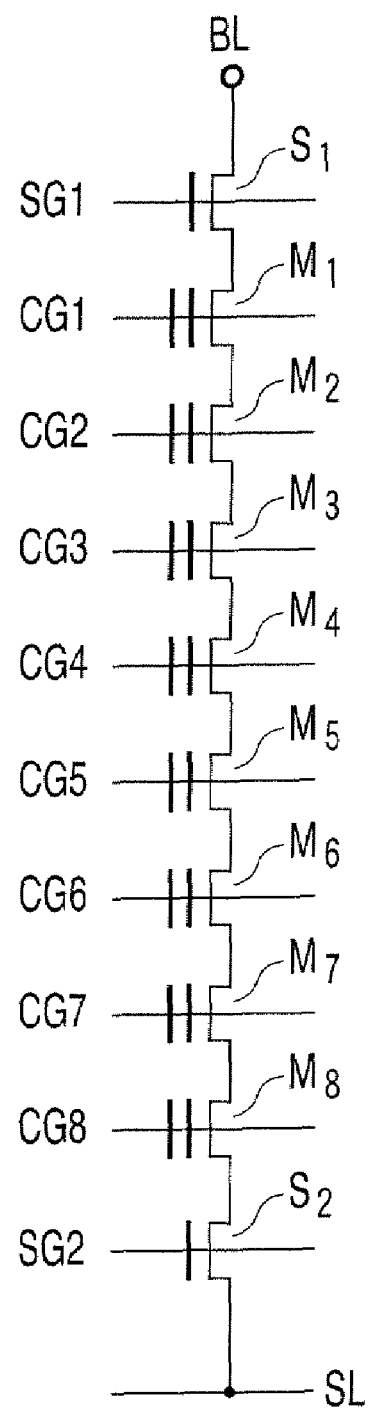
FIG. 3B is an equivalent circuit diagram of FIG. 3A, for illustrating one NAND cell portion extracted from the memory cell array in the NAND cell type EEPROM.
Figure 4A:
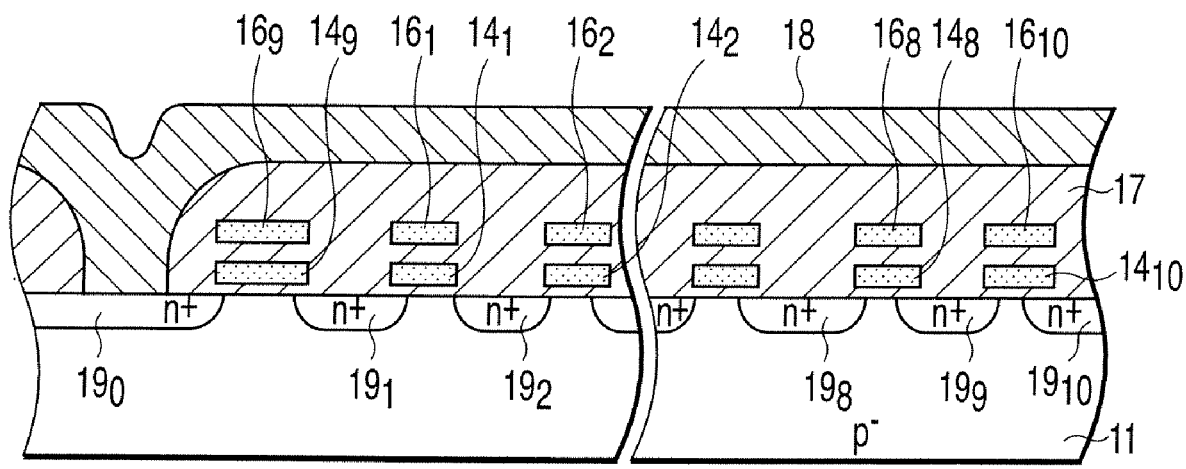
FIG. 4A is a cross-sectional view taken along the 4A-4A line of a pattern shown in FIG. 3A.
Figure 4B:
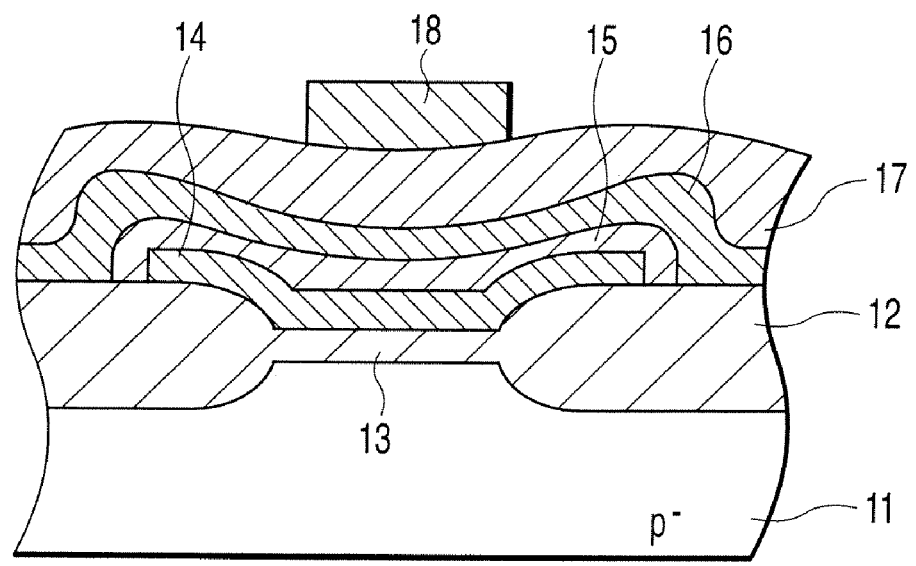
FIG. 4B is a cross-sectional view taken along the 4B-4B line of the pattern shown in FIG. 3A.

FIGS. 3A and 3B are a pattern plan view and equivalent circuit diagram showing one NAND cell portion extracted from the memory cell array in the NAND cell type EEPROM. FIGS. 4A, 4B are cross sectional views respectively taken along the 4A-4A line and 4B-4B line of the pattern shown in FIG. 3A.

The memory cell array is formed in a cell p-type well region in a cell n-type well region formed in a p-type semiconductor substrate (for example, silicon substrate). In a cell p-type well region (or a p-type silicon substrate) 11 surrounded by an element isolation oxide film 12, a memory cell array configured by a plurality of NAND cells is formed.

The NAND cell is configured by serially connecting a plurality of memory cells with the n-channel MOSFET structure having a floating gate used as a charge storage layer and a control gate stacked on each other with the source or drain commonly used by the adjacent memory cells. The series-connected memory cells are used as one unit and connected to a corresponding one of the bit lines BL.

The explanation is made below with much attention paid to one NAND cell. In this example, eight memory cells $M_1$, $M_2$, . . . , $M_8$ are serially connected to configure one NAND cell. Each of the memory cells $M_1$, $M_2$, . . . , $M_8$ is formed by forming a floating gate 14 ($14_1$, $14_2$, $14_3$, . . . , $14_8$) above the cell p-type well region 11 with a gate insulating film 13 disposed therebetween and stacking a control gate 16 ($16_1$, $16_2$, $16_3$, . . . , $16_8$) above the floating gate 14 with an insulating film 15 disposed therebetween. The memory cells are serially connected while each of n-type diffusion layers 19 ($19_1$, $19_2$, $19_3$, . . . , $19_8$) which are the sources or drains of the memory cells is commonly used by the adjacent memory cells.

The first and second selection transistors $S_1$ and $S_2$ are provided on the drain side and source side of the NAND cell. The selection transistors $S_1$ and $S_2$ have first selection gates $14_9$, $16_9$ and second selection gates $14_{10}$, $16_{10}$ which are formed at the same time as formation of the floating gate and control gate of the memory cell. The selection gates $14_9$, $16_9$ are electrically connected to each other in a region (not shown), the selection gates $14_{10}$, $16_{10}$ are electrically connected to each other in a region (not shown), and the selection gates function as the gate electrodes of the selection transistors $S_1$ and $S_2$.

The upper surface of the substrate on which elements are formed is covered with a CVD oxide film 17 and bit lines 18 are arranged on the oxide film. The control gates $16_1$, $16_2$, . . . , $16_8$ of the NAND cell are continuously formed in the row direction, commonly used in the same NAND block and function as the control gate lines CG1, CG2, . . . , CG8. The control gate lines are used as word lines. The selection gates $14_9$, $16_9$ and $14_{10}$, $16_{10}$ are also continuously formed in the row direction and function as the selection gate lines SG1, SG2.

FIG. 5 shows the distributions of the threshold voltages of the memory cells $M_1$, $M_2$, . . . , $M_8$ of the NAND cell. In this example, "0" corresponds to a program state and "1" corresponds to an erase state.

With the above configuration, at the data read time, the bit line BL is precharged to power supply voltage Vcc and then set to an electrically floating state and the control gate connected to the selected memory cell is set to 0 V. Further, the selection gate lines and control gate lines connected to the memory cells other than the selected memory cell are set to voltage Vread (for example, 3.5 V) output from the Vread booster circuit 30 and the source line SL is set to 0 V. Then, data is read by detecting whether or not a current flows into the selected memory cell based on a variation in the bit line potential. That is, since the memory cell is set to the off state if data programmed in the memory cell is "0" (threshold voltage Vth of memory cell>0), the bit line is kept at the precharge potential. On the other hand, if program data is "1" (threshold voltage Vth of memory cell<0), the memory cell is set to the on state and the bit line potential is lowered from the precharge potential by ΔV. Thus, data is read from the memory cell by detecting a variation in the bit line potential by use of the sense amplifier.

Further, at the data write time, 0 V ("0" programming) or power supply voltage Vcc ("1" programming) is applied to the bit line BL according to data to be programmed. The selection gate line SG1 connected to the selection transistor $S_1$ which connects the NAND cell to the bit line BL is set to Vcc and the selection gate line SG2 connected to the selection transistor $S_2$ which connects the NAND cell to the source line SL is set to 0 V. At this time, 0 V is transmitted to the channel of the memory cell in which "0" is to be programmed. Since the selection transistor $S_1$ is turned off in the case of "1" programming, the potential of the channel of the memory cell in which "1" is to be programmed is set to (Vcc−Vthsg) (Vthsg is the threshold voltage of the selection transistor) and is set to an electrically floating state. Alternatively, when the threshold voltage of the memory cell lying nearer to the bit line than the memory cell to be programmed is equal to positive voltage Vthcell, the channel potential of the memory cell is set to (Vcc−Vthcell).

After this, boosted program potential Vpgm (=approximately 20 V) is applied to the control gate line connected to the selected memory cell and intermediate potential Vpass (=approximately 10 V) is applied to the control gate lines connected to the other non-selected memory cells. As a result, since the channel potential is 0 V at the time of data "0", high voltage is applied between the floating gate and the substrate of the selected memory cell and electrons are injected via the tunnel from the substrate to the floating gate to change the threshold voltage in a positive direction. At the time of data "1", the potential of the channel set in the floating state is set to intermediate potential by the capacitive coupling with the control gate and no electron is injected.

In the write operation of the NAND cell type EEPROM, a verify read operation is performed to check whether or not the program operation is satisfactorily performed after application of the program pulse. The program operation is performed again with respect to the memory cell in which it is determined that the program operation is not satisfactorily performed in the verify read operation. In the verify read operation, the same operation as the above read operation is performed except that the selected control gate line is not set to 0 V and is set to potential Vvfy (for example, 0.5 V) shown in FIG. 5. The reason why the control gate line is set to the potential Vvfy higher than 0 V is to attain a sufficient operation margin of the read operation by programming the memory cell to the sufficiently high threshold voltage.

The data erase operation is substantially simultaneously performed for each block unit. That is, all of the control gate lines of the block to be subjected to the erase operation are set to 0 V and then boosted potential Vera (approximately 20 V) is applied to the cell p-type well region and cell n-type well region. The potentials of the control gate lines of the block which is not subjected to the erase operation are boosted to the potential Vera by the capacitive coupling with the cell p-type well region from the potential set in the floating state. As a result, electrons in the floating gates of the memory cells in the block subjected to the erase operation are discharged into the cell p-type well region to change the threshold voltage in a negative direction. In the block which is not subjected to the erase operation, since the control gate line and cell p-type well region are set at the boosted voltage Vera, no erase operation is performed.

In the present embodiment, in the read operation or verify read operation, when a memory cell from which data is to be read is accessed, the temperature dependency of read voltage output from the read voltage generating circuit 29 is set by the switching circuit 35 based on data stored in the memory circuit 34 to change the temperature characteristic and information (for example, column address) corresponding to the distance from the sense point to the memory cell subjected to the read operation. Then, read voltage having the thus set temperature dependency is applied to the control gate line (word line) connected to a memory cell subjected to the read operation to read data.

By thus changing the temperature dependency (voltage applied to the control gate of the selected memory cell) of read voltage output from the read voltage generating circuit 29 according to the distance from the sense point to the memory cell in the memory cell array 21, a current flowing in the memory cell which varies with a temperature variation can be compensated for.

Thus, the threshold voltages of memory cells having the highest threshold voltage are lowered to narrow the distribution of the threshold voltages of the memory cells and, as a result, the data holding characteristic can be enhanced.

As shown in FIG. 6, it is predicted that the resistance (sheet resistance) of the bit line BL rapidly becomes higher as the design rule (the width of the bit line) becomes smaller in the order of 90 nm, 70 nm, 55 nm. For example, in a copper (Cu) wiring, a barrier film of SiN or SiCN is formed to prevent exudation of copper. In the case of an aluminum (Al) wiring, it is necessary to form a barrier film of Ti or TiN. Since preset film thickness is required in order to cause the barrier films to perform initially designed functions, there is a physical limitation to the operation of thinning the barrier film. Therefore, even if the width of the wiring itself can be narrowed, the film thickness of the barrier film cannot be made small. Further, if the bit line is formed with the damascene structure in order to enhance the integration density, the aspect ratio of grooves becomes larger as the bit line width becomes smaller and the manufacturing process becomes difficult. Therefore, it is necessary to make the bit line thin.

From the reason described above, the relation between the bit line width and the sheet resistance does not become linear and the sheet resistance rapidly increases with a reduction in the bit line width as shown in FIG. 6.

As a result, if the design rule is set equal to 90 nm or less when the bit line is formed of an aluminum wiring, a memory cell current markedly varies according to the distance from the sense point. In the case of a copper wiring, if the design rule is set equal to 70 nm or less, a memory cell current markedly varies according to the distance from the sense point.

Therefore, in a nonvolatile semiconductor memory device in which the design rule is set to 90 nm or less in the case of an aluminum wiring and the design rule is set to 70 nm or less in the case of an copper wiring, a current flowing in the memory cell varies with a temperature variation and a variation in the distribution of the threshold voltages can be effectively compensated for by causing the temperature dependency of the read voltage to vary according to the distance from the sense point to the memory cell in the memory cell array 21.

[Modification 1 of Memory Circuit]

In the above explanation, a case wherein the temperature characteristic of the word line voltage set during the write verify read operation is changed according to the column address is explained as an example. However, information which causes the temperature characteristic of the memory cell in the memory cell array 21 to vary and a block address and plane in the memory cell array 21 are stored in the memory circuit 34 and the temperature dependency of the read voltage output from the read voltage generating circuit 29 may be switched based on the above information items by use of the switching circuit 35.

Thus, a variation in the temperature characteristic of the memory cell which is caused by a difference in the pattern of peripheral portions such as regions in which the wirings are densely and coarsely arranged in a single chip can be compensated for by storing the plane and block address in the memory cell array 21 and taking the relation with respect to the environment of the surroundings into consideration.

Of course, a variation in the current flowing in the memory cell caused by a temperature variation can be more effectively compensated for by storing the column address in addition to the plane and block address and taking the distance from the sense point into consideration.

[Modification 2 of Memory Circuit]

Further, the memory cells of the memory cell array 21 may be divided into a plurality of groups with different temperature dependencies and information which causes the temperature characteristic of the memory cell in the memory cell array 21 to vary and information used to identify one of the plurality of memory cell groups to which an accessed memory cell belongs may be stored in the memory circuit 34. Then, the temperature dependency of the read voltage output from the read voltage generating circuit 29 can be switched based on the above information items by use of the switching circuit 35.

Thus, a variation in the temperature characteristic of the memory cell can be compensated for each of desired memory cell groups having different temperature dependencies.

[Modification 3 of Memory Circuit]

Further, information which causes the temperature characteristic of the memory cell in the memory cell array 21 to vary and information of a position in which the chip of the nonvolatile semiconductor memory device is formed in the wafer may be stored in the memory circuit 34. Then, the temperature dependency of the read voltage output from the read voltage generating circuit 29 can be switched based on the above information items by use of the switching circuit 35.

Thus, a variation in the temperature characteristic of the memory cell caused by a difference in the etching rate due to a difference in the environment of the surroundings, aberration and distortion of the optical system of an exposure device depending on a position of the wafer in which the chip is formed, for example, depending on the central portion and peripheral portion of the wafer can be compensated for.

[Modification 4 of Memory Circuit]

By selectively combining the first embodiment and the modifications 1 to 3, a variation in the temperature characteristic of the memory cell can be finely compensated for based on various information items.

[Read Voltage Generating Circuit]

Figure 7:
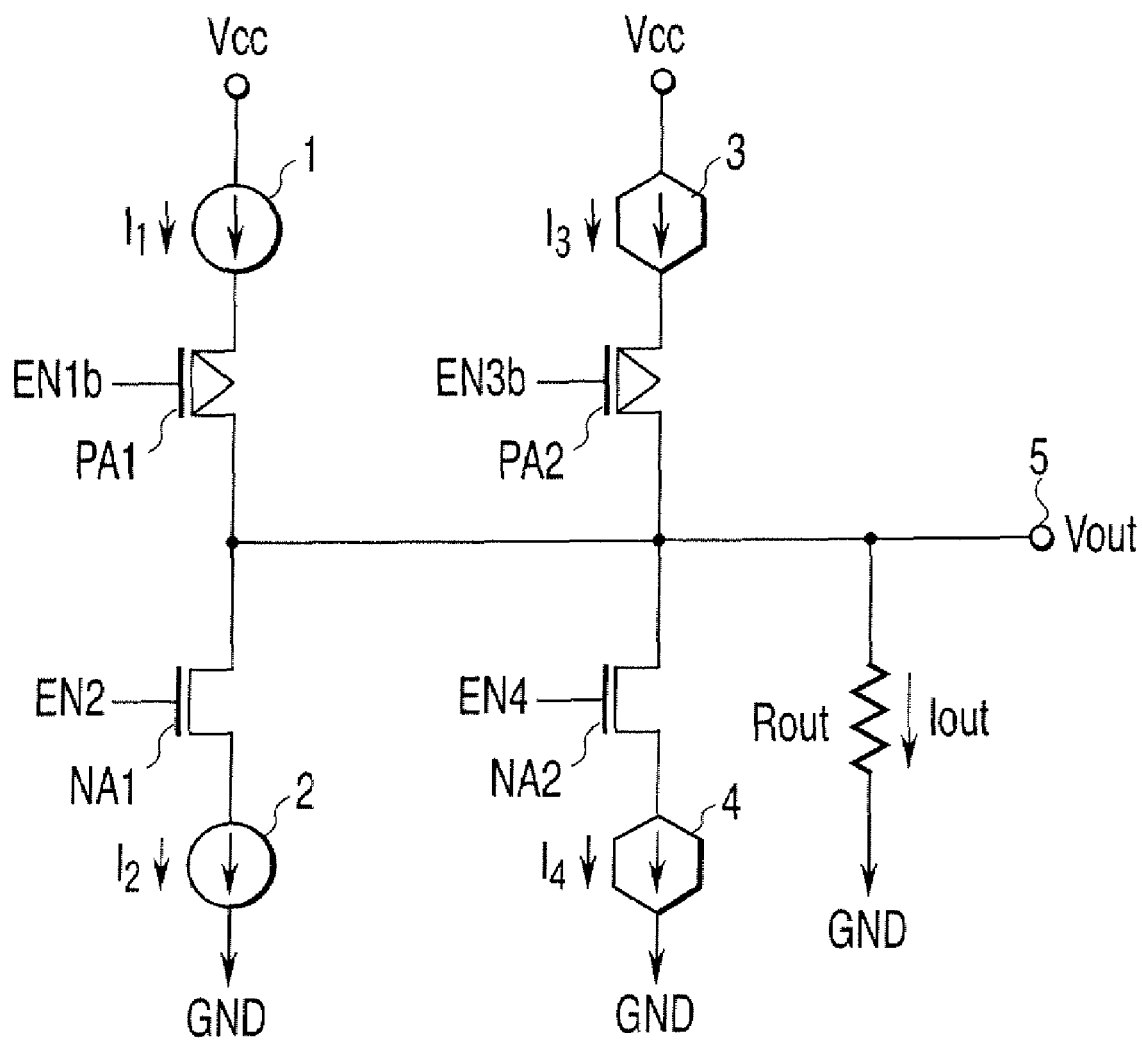
FIG. 7 is a conceptual diagram for illustrating a read voltage generating circuit in the NAND cell type EEPROM shown in FIG. 1.

FIG. 7 is a conceptual diagram for illustrating the read voltage generating circuit 29 in the NAND cell type EEPROM shown in FIG. 1.

The read voltage generating circuit 29 includes current sources 1, 2 each generating a constant current which is independent of the temperature, current sources 3, 4 which generate currents varying in proportion to a temperature variation, P-channel MOS transistors PA1, PA2, N-channel MOS transistors NA1, NA2 and a resistor Rout. The read voltage generating circuit 29 sets the temperature dependency of output voltage Vout according to enable signals EN1$b$, EN2, EN3$b$, EN4 generated from the switching circuit 35 based on information stored in the memory circuit 34.

The current source 1 and MOS transistor PA1 are serially connected between the power supply node Vcc and the output terminal 5 and the enable signal EN1$b$ is supplied to the gate of the MOS transistor PA1. The MOS transistor NA1 and current source 2 are serially connected between the output terminal 5 and the ground node GND and the enable signal EN2 is supplied to the gate of the MOS transistor NA1. Further, the current source 3 and MOS transistor PA2 are serially connected between the power supply node Vcc and the output terminal 5 and the enable signal EN3$b$ is supplied to the gate of the MOS transistor PA2. The MOS transistor NA2 and current source 4 are serially connected between the output terminal 5 and the ground node GND and the enable signal EN4 is supplied to the gate of the MOS transistor NA2. The resistor Rout functioning as a current/voltage converter is connected between the output terminal 5 and the ground node GND. In this example, as the current/voltage converter, the resistor is used, but a MOS transistor may be used, for example.

In this example, a current which flows in the current source 1 and is independent of the temperature is defined as $I_1$, a current which flows in the current source 2 and is independent of the temperature is defined as $I_2$, a current flowing in the current source 3 and varying in proportion to the temperature is defined as $I_3$, a current flowing in the current source 4 and varying in proportion to the temperature is defined as $I_4$, and a current flowing through the resistor Rout is defined as Iout.

Next, the operation of the read voltage generating circuit 29 with the above configuration is explained.

(1) In case of setting positive temperature characteristic:

The enable signals EN1$b$, EN2, EN3$b$, EN4 are set low. As a result, the MOS transistors PA1, PA2 are set to the on state and the MOS transistors NA1, NA2 are set to the off state so that the current Iout flowing through the resistor Rout may be expressed by the following equation.

$$Iout=I_1+I_3$$

As a result, the output voltage Vout is expressed by the following equation.

$$Vout=Rout \times Iout=Rout \times (I_1+I_3)$$

That is, the output voltage is set to voltage which varies in proportion to the temperature with respect to the voltage (Rout×$I_1$).

Alternatively, the enable signals EN3$b$, EN4 can be set low and the enable signals EN1$b$, EN2 can be set high. In this case, the current Iout flowing through the resistor Rout is expressed as follows.

$$Iout=I_3-I_2$$

As a result, the output voltage Vout is expressed by the following equation.

$$Vout=Rout \times Iout=Rout \times (I_3-I_2)$$

Also, in this case, the output voltage is set to voltage which increases with a temperature rise with respect to a desired voltage value.

(2) In case of setting negative temperature characteristic:

The enable signals EN1$b$, EN2 are set low and the enable signals EN3$b$, EN4 are set high. As a result, since the MOS transistors PA1, NA2 are set to the on state and the MOS transistors NA1, PA2 are set to the off state, the current Iout flowing through the resistor Rout is expressed by the following equation.

$$Iout=I_1-I_4$$

As a result, the output voltage Vout is expressed by the following equation.

$$Vout=Rout \times Iout=Rout \times (I_1-I_4)$$

That is, the output voltage is set to voltage which decreases in proportion to the temperature with respect to the voltage (Rout×$I_1$).

(3) In case of eliminating temperature dependency:

The enable signals EN1b, EN2, EN4 are set low and the enable signal EN3b is set high. As a result, since the MOS transistor PA1 is set to the on state and the MOS transistors NA1, NA2, PA2 are set to the off state, the current Iout flowing through the resistor Rout is expressed by the following equation.

$$Iout=I_1$$

As a result, the output voltage Vout is expressed by the following equation.

$$Vout=Rout \times Iout=Rout \times I_1$$

That is, the output voltage does not depend on the temperature.

Thus, the voltage for setting the positive temperature characteristic, the voltage for setting the negative temperature characteristic and the voltage used to eliminate the temperature dependency are selectively set to change (for example, compensate for) the temperature dependency of the memory cell according to the distance from the sense point to an accessed memory cell, one of a plurality of memory cell groups with different temperature dependencies to which the accessed memory cell belongs, the position of the wafer in which the chip of the nonvolatile semiconductor memory device is formed or the like.

[Concrete Example of Read Voltage Generating Circuit]

Next, the concrete circuit example of the read voltage generating circuit 29 is explained in detail. FIG. 8A shows a current generating circuit which generates a current varying in proportion to a temperature. The circuit includes an operational amplifier OP1, P-channel MOS transistors TP1 to TP3, N-channel MOS transistor TN1, resistor R2 and diodes D3, D4. Potential Va is applied to the inverting input terminal (−) of the operational amplifier OP1 and potential Vb is applied to the non-inverting input terminal (+) thereof. The output terminal of the operational amplifier OP1 is connected to the gates of the MOS transistors TP1 to TP3. The sources of the MOS transistors TP1, TP2 are connected to the power supply node Vcc, the drain of the MOS transistor TP1 is connected to the anode of the diode D3 and the drain of the MOS transistor TP2 is connected to one end of the resistor R2. The cathode of the diode D3 is connected to the ground node GND and the potential Va on the anode side of the diode D3 is supplied to the inverting input terminal (−) of the operational amplifier OP1. The other end of the resistor R2 is connected to the anodes of N diodes D4 and the cathodes of the diodes D4 are connected to the ground node GND. The potential Vb on one-end side of the resistor R2 is supplied to the non-inverting input terminal (+) of the operational amplifier OP1.

The source of the MOS transistor TP3 is connected to the power supply node Vcc, the drain thereof is connected to the drain and gate of the MOS transistor TN1. The source of the MOS transistor TN1 is connected to the ground node GND. The potential of the output terminal of the operational amplifier OP1 is output as V1 and the potential of a common connection node of the drains of the MOS transistors TP3 and TN1 is output as V2.

With the above configuration, the potential V1 is controlled by the operational amplifier OP1 so as to set the potential Va equal to the potential Vb. At this time, a current $I_{10}$ flowing through the resistor R2 is expressed as follows.

$$I_{10}=(VT/R2) \times lnN \qquad (1)$$

where VT=kT/q (k is a Bolzmann's constant, q is the charge amount of an electron and T is the absolute temperature). As is clearly understood from the equation (1), the current $I_{10}$ varies in proportion to the absolute temperature T. Further, the current $I_{10}$ is a stable current which is independent of the power supply voltage Vcc and the threshold voltage of the MOS transistor.

FIG. 8B shows a constant current generating circuit generating a current which is independent of a temperature. The circuit includes an operational amplifier OP2, P-channel MOS transistors TP4, TP5, N-channel MOS transistor TN2 and resistor R3. Reference potential Vref is applied to the inverting input terminal (−) of the operational amplifier OP2 and the output terminal thereof is connected to the gates of the MOS transistors TP4, TP5. The source of the MOS transistor TP4 is connected to the power supply node Vcc and the drain thereof is connected to the non-inverting input terminal (+) of the operational amplifier OP2 and one end of the resistor R3. The other end of the resistor R3 is connected to the ground node GND.

Further, the source of the MOS transistor TP5 is connected to the power supply node Vcc and the drain thereof is connected to the drain and gate of the MOS transistor TN2. The source of the MOS transistor TN2 is connected to the ground node GND. Potential of the output terminal of the operational amplifier OP2 is output as V3 and potential of a common connection node of the drains of the MOS transistors TP5, TN2 is output as V4.

Figure 9:
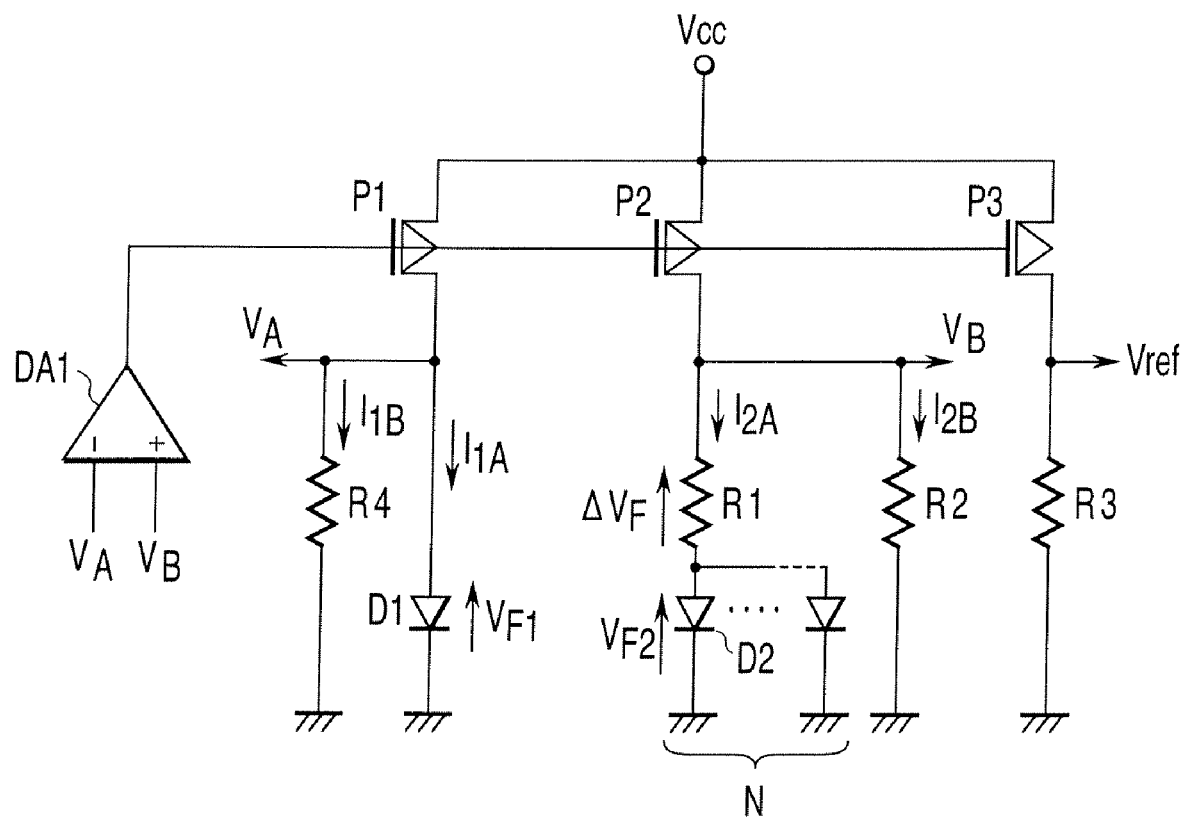
FIG. 9 is a circuit diagram showing a band gap reference circuit which generates reference potential.

The reference potential Vref is voltage which is independent of the threshold voltage of the MOS transistor, temperature, power supply voltage Vcc and the like and is generated by a band gap reference circuit as shown in FIG. 9, for example. The circuit is described in Banba et al., VLSI Symposium 98 Digest of Technical Papers P. 228-229. Refer to the above document to study the detail contents of the circuit. A current $I_{20}$ flowing through the resistor R3 in the circuit of FIG. 8B is expressed as follows.

$$I_{20}=Vref/R3$$

Since Vref is independent of the temperature, the current $I_{20}$ becomes a stable current which is independent of the threshold voltage of the MOS transistor, temperature, power supply voltage and the like.

Figure 10:
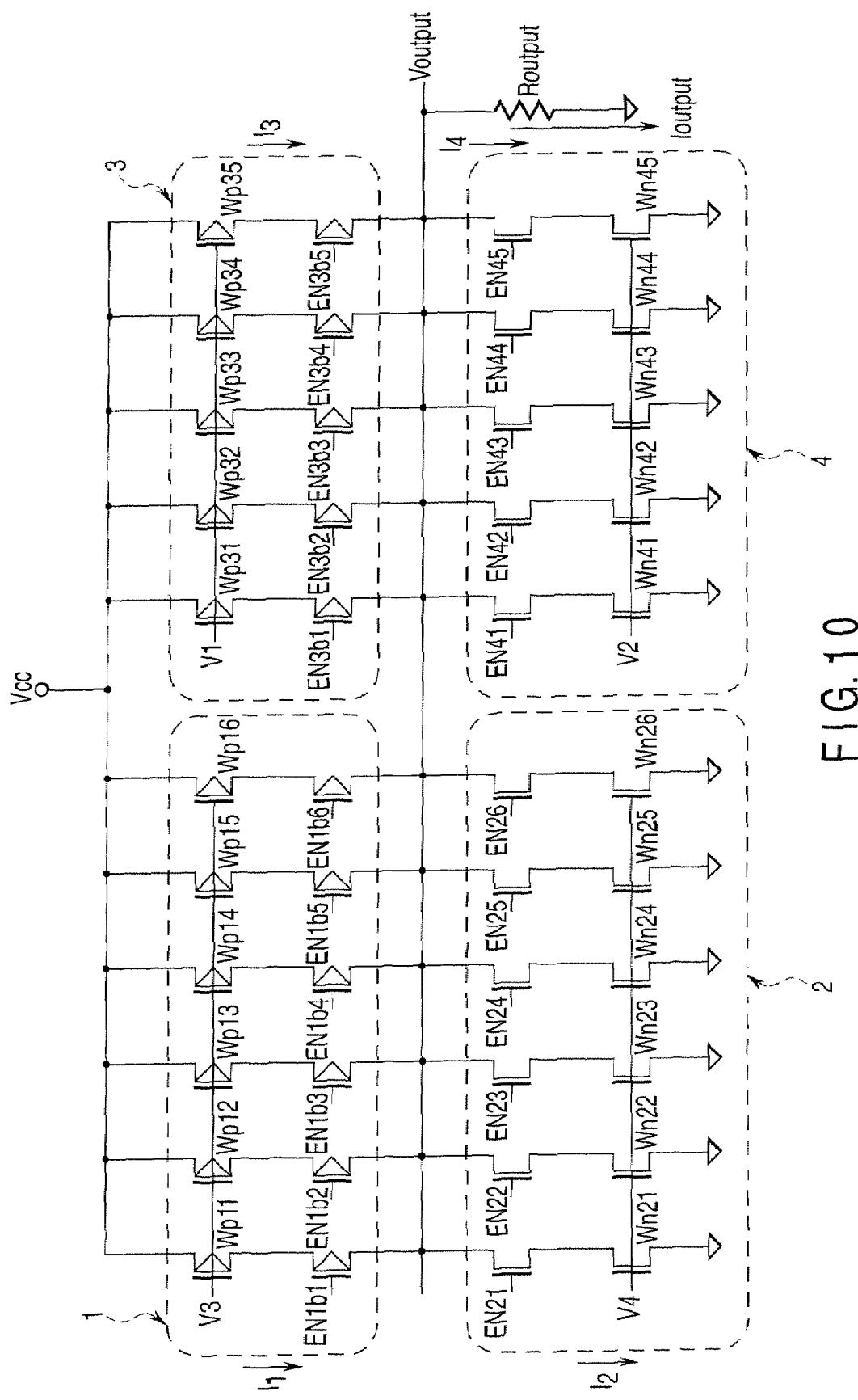
FIG. 10 is a diagram showing a circuit which derives the sum/difference of a current which varies in proportion to a temperature and a current which is independent of the temperature.

FIG. 10 shows a circuit which derives the sum of or difference between a current which varies in proportion to the temperature and a current which is independent of the temperature. The gate potentials of P-channel MOS transistors Wp11 to Wp16 in the current source 1 are set equal to potential V3 generated from the constant current source (FIG. 8B) which is independent of the temperature. As a result, the current source 1 supplies a current $I_1$ which is independent of the temperature. The magnitude of the current $I_1$ is determined by the total sum of the channel widths of the MOS transistors which are set in the on state in the current source 1. For example, if only the enable signal EN1b1 is set low and the other enable signals EN1b2, EN1b3, . . . , EN1b6 are set high, the current $I_1$ expressed by the following equation can be attained.

$$I_1 = (Wp11/Wp2) \times I_{20}$$
$$= (Wp11/Wp2) \times (Vref/R3)$$

Further, if the enable signals EN1$b$1, EN1$b$2, EN1$b$3 are set low and the other enable signals EN1$b$4, EN1$b$5, EN1$b$6 are set high, the current $I_1$ expressed by the following equation can be attained.

$$I_1 = [(Wp11 + Wp12 + Wp13)/Wp2] \times I_{20}$$
$$= (Wp11 + Wp12 + Wp13)/Wp2] \times (Vref/R3)$$

Thus, the current of a desired value which is independent of the temperature can be supplied by selectively switching high/low the enable signals EN1$b$1, EN1$b$2, EN1$b$3, ..., EN1$b$5, EN1$b$6.

Likewise, potential V4 generated from the circuit shown in FIG. 8B is input to the gates of N-channel MOS transistors Wn21 to Wn26 in the current source 2 to discharge a current $I_2$ which is independent of the temperature into the ground node GND. The magnitude of the current $I_2$ is determined by the total sum of the channel widths of the MOS transistors which are set in the on state in the current source 2. For example, if only the enable signal EN21 is set high and the other enable signals EN22, EN23, ..., EN26 are set low, the current $I_2$ expressed by the following equation can be attained.

$$I_2 = (Wn21/Wn2) \times I_{20}$$
$$= (Wn21/Wn2) \times (Vref/R3)$$

Further, if the enable signals EN22, EN23 are set high and the other enable signals EN21, EN24, EN25, EN26 are set low, the current $I_2$ expressed by the following equation can be attained.

$$I_2 = [(Wn22 + W23)/Wn2] \times I_{20}$$
$$= (Wn22 + Wn23)/Wn2] \times (Vref/R3)$$

Thus, the current of a desired value which is independent of the temperature can be supplied by selectively switching the high/low the enable signals EN21, EN22, ..., EN25, EN26.

Since the gate potentials of P-channel MOS transistors Wp31 to Wp35 in the current source 3 are set equal to potential V1 generated from the constant current source (FIG. 8A) and varying in proportion to the temperature, the current source 3 supplies a current $I_3$ which varies in proportion to the temperature. The magnitude of the current $I_3$ is determined by the total sum of the channel widths of the MOS transistors which are set in the on state in the current source 3. For example, if only the enable signal EN3$b$1 is set low and the other enable signals EN3$b$2, EN3$b$3, ..., EN3$b$5 are set high, the current $I_3$ expressed by the following equation can be attained.

$$I_3 = (Wp31/Wp1) \times I_{10}$$
$$= (Wp31/Wp1) \times (VT/R2) \times 1nN$$

Further, if the enable signals EN3$b$1, EN3$b$2 are set low and the other enable signals EN3$b$3, EN3$b$4, EN3$b$5 are set high, the current $I_3$ expressed by the following equation can be attained.

$$I_3 = [(Wp31 + Wp32)/Wp1] \times I_{10}$$
$$= (Wp31 + Wp32)/Wp1] \times (VT/R2) \times 1nN$$

Thus, the current of a desired value which varies in proportion to the temperature can be supplied by selectively switching high/low the enable signals EN3$b$1, EN3$b$2, ..., EN3$b$5.

Likewise, potential V2 generated from the circuit shown in FIG. 8A is input to the gates of N-channel MOS transistors Wn41 to Wn45 in the current source 4 to discharge a current $I_4$ which varies in proportion to the temperature. The magnitude of the current $I_4$ is determined by the total sum of the channel widths of the MOS transistors which are set in the on state in the current source 4. For example, if only the enable signal EN41 is set high and the other enable signals EN42, EN43, ..., EN45 are set low, the current $I_4$ expressed by the following equation can be attained.

$$I_4 = (Wn41/Wn1) \times I_{10}$$
$$= (Wn41/Wn1) \times (VT/R2) \times 1nN$$

Further, if the enable signals EN41, EN42 are set high and the other enable signals EN43, EN44, EN45 are set low, the current $I_4$ expressed by the following equation can be attained.

$$I_4 = [(Wn41 + Wn42)/Wn1] \times I_{10}$$
$$= (Wn41 + Wn42)/Wn1] \times (VT/R2) \times 1nN$$

Thus, the current of a desired value which varies in proportion to the temperature can be supplied by selectively switching high/low the enable signals EN41, EN42, ..., EN45.

Next, the operation of the circuit shown in FIGS. 8A, 8B, 9 and 10 is explained.

(1) In case of setting positive temperature characteristic:

In the circuit of FIG. 10, all of the MOS transistors in the current sources 2, 4 whose gates are supplied with the enable signals EN21, EN22, EN23, ..., EN26 and enable signals EN41, EN42, EN43, ..., EN45 are turned off by setting the above enable signals low. Further, all of the MOS transistors in the current sources 1, 3 whose gates are supplied with the enable signals EN1$b$1, EN1$b$2, EN1$b$3, ..., EN1$b$6 and enable signals EN3$b$1, EN3$b$2, EN3$b$3, ..., EN3$b$5 are turned on by setting the above enable signals low. As a result, a current Ioutput flowing through the resistor Routput and expressed by the following equation can be attained.

Ioutput=$I_1$+$I_3$

Thus, the output voltage Voutput is expressed as follows.

Voutput=Routput×Ioutput=($I_1$+$I_3$)×Routput

That is, the output voltage Voutput is set to voltage which varies in proportion to the temperature with respect to the voltage (Routput×$I_1$). Vout is a function of the ratio of the resistance elements (for example, Rout/R2). Therefore, even if the resistance of the resistance element is changed according to a fluctuation in the process and a temperature variation, the output voltage Voutput does not vary.

As described above, the value of the current $I_1$ can be variously changed by selectively switching high/low the enable signals EN1b1, EN1b2, ..., EN1b5, EN1b6. Further, the value of the current $I_3$ can be variously changed by selectively switching high/low the enable signals EN3b1, EN3b2, ..., EN3b5. As a result, the voltage Voutput having various positive temperature characteristics and various values can be generated.

Alternatively, all of the MOS transistors in the current sources 1, 4 whose gates are supplied with the enable signals EN1b1, EN1b2, ..., EN1b6 and enable signals EN41, EN42, EN43, ..., EN45 may be turned off by setting the above enable signals EN1b1, EN1b2, ..., EN1b6 high and setting the enable signals EN41, EN42, EN43, ..., EN45 low. By turning on the MOS transistors in the current sources 2, 3, the current Ioutput flowing through the resistor Routput expressed by the following equation can be attained.

$$Ioutput = I_3 - I_2$$

As a result, the output voltage Voutput is expressed as follows.

$$Voutput = Routput \times Ioutput = Routput \times (I_3 - I_2)$$

Also, in this case, since the currents $I_2$, $I_3$ can be set to various values by changing the total sum of the channel widths of the MOS transistors which are set in the on state in the current sources 2, 3, the voltage Voutput having various values and various positive temperature characteristics can be generated.

(2) In case of setting negative temperature characteristic:

In the circuit of FIG. 10, all of the MOS transistors in the current sources 2, 3 whose gates are supplied with the enable signals EN21, EN22, BN23, ..., EN26 and enable signals EN3b1, EN3b2, EN3b3, ..., EN3b5 are turned off by setting the enable signals EN21, EN22, EN23, ..., EN26 low and setting the enable signals EN3b1, EN3b2, EN3b3, ..., EN3b5 high. Further, by turning on the MOS transistors in the current sources 1, 4, a current Ioutput flowing through the resistor Routput and expressed by the following equation can be attained.

$$Ioutput = I_1 - I_4$$

Thus, the output voltage Voutput is expressed as follows.

$$Voutput = Routput \times Ioutput = Routput \times (I_1 - I_4)$$

That is, the output voltage Voutput is set to voltage which decreases with a temperature rise with respect to the voltage (Routput×$I_1$).

As described above, the value of the current $I_1$ can be variously changed by selectively switching high/low the enable signals EN1b1, EN1b2, ..., EN1b5, EN1b6. Further, the value of the current $I_4$ can be variously changed by selectively switching high/low the enable signals EN41, EN42, ..., EN45. As a result, the voltage Voutput having various positive temperature characteristics and various values can be generated.

(3) In case of eliminating temperature characteristic:

In the circuit of FIG. 10, all of the MOS transistors in the current sources 2, 3, 4 whose gates are supplied with the enable signals EN21, EN22, EN23, EN26, enable signals EN3b1, EN3b2, EN3b3, ..., EN3b5 and enable signals EN41, EN42, EN43, ..., EN45 are turned off by setting the enable signals EN21, EN22, EN23, ..., EN26 and enable signals EN41, EN42, EN43, ..., EN45 low and setting the enable signals EN3b1, EN3b2, EN3b3, EN3b5 high. Further, by turning on the MOS transistors in the current source 1, a current Ioutput flowing through the resistor Routput and expressed by the following equation can be attained.

$$Ioutput = I_1$$

Thus, the output voltage Voutput is expressed as follows.

$$Voutput = Routput \times Ioutput = Routput \times I_1$$

That is, the output voltage Voutput becomes independent of the temperature.

As described above, the value of the current $I_1$ can be variously changed by selectively switching high/low the enable signals EN1b1, EN1b2, ..., EN1b5, EN1b6. As a result, the voltage Voutput which has various values and is independent of the temperature can be generated.

Since the currents generated by the constant current generating circuit shown in FIGS. 8A and 8B are independent of the power supply voltage Vcc and the threshold voltage of the MOS transistor, the output voltage Voutput generated by the circuit shown in FIG. 10 is set to stable voltage which is independent of the power supply voltage Vcc and the threshold voltage of the MOS transistor.

Figure 11A:
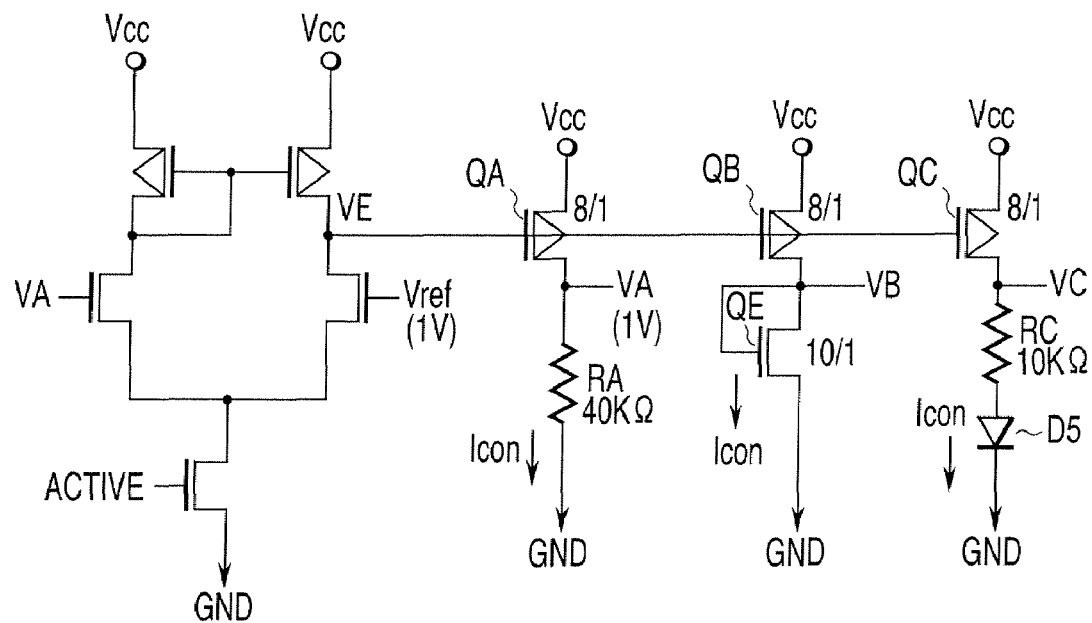
FIG. 11A is a diagram showing a circuit which generates a constant current which is independent of the temperature, for illustrating another configuration example of the current generating circuit shown in FIGS. 8A and 8B.
Figure 11B:
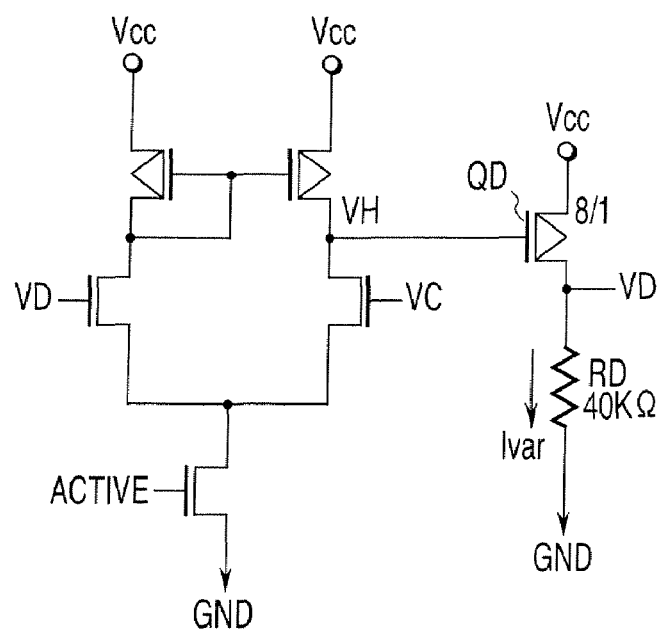
FIG. 11B is a diagram showing a circuit which generates a current which decreases with the temperature rise, for illustrating another configuration example of the current generating circuit shown in FIGS. 8A and 8B.

FIGS. 11A and 11B are circuit diagrams for illustrating other examples of the configurations of the current generating circuits shown in FIGS. 8A and 8B.

ACTIVE is an operational amplifier activating signal and is set to a Vdd (power supply voltage or in-chip power supply voltage) level during the operation. Vref is constant voltage (1 V) which is generated by a band gap reference circuit and is independent of the temperature. The circuit of FIG. 11A generates a constant current Icon which is independent of the temperature and the circuit of FIG. 11B generates a current Ivar which decreases in proportion to the temperature. In FIGS. 11A and 11B, since potential VA is controlled so as to be set equal to the reference potential Vref, the current Icon expressed as follows can be attained.

$$Icon = Vref/RA$$

Thus, the current Icon is set to a constant current which is independent of the temperature. Further, a current flowing through the diode D5 is constant. In this case, potential VC decreases in proportion to a temperature rise. That is, the following equation can be attained.

$$VC = B1 - B2 \times T$$

where B1, B2 are constants.

Since potential VD is controlled so as to be set constant together with the potential VC, the current Ivar can be expressed as follows.

$$Ivar = VD/RD = VC/RD = C1 - C2 \times T$$

where C1, C2 are constants.

Thus, a current which decreases or increases in proportion to the temperature and has a desired absolute value can be attained by doing addition or subtraction of Icon and Ivar.

In the circuits shown in FIGS. 11A and 11B, the current Icon is set to approximately 25 μA when the ratio of the channel width/channel length of P-channel MOS transistors QA, QB, QC, QD is set to 8/1, the ratio of the channel width/channel length of an N-channel MOS transistor QE is set to 10/1, the resistance of the resistor RA is set to 40 kΩ, the resistance of the resistor RC is set to 10 kΩ and the resistance of the resistor RD is set to 40 kΩ.

Further, the resistor RC can be eliminated in the circuit of FIG. 11A. The resistor RC is inserted to enhance voltage VC so as to operate the P-channel MOS transistor QC in the saturation region.

FIGS. 12A, 12B to FIGS. 14A, 14B are circuit diagrams for illustrating cases wherein various voltages having the same temperature dependency are generated by doing addition/subtraction of the current Icon and current Ivar generated by the circuits of FIGS. 11A and 11B. In FIGS. 11A, 11B to FIGS. 14A, 14B, Vcg10 indicates word line voltage when the "10" state of FIG. 16 is read, Vcg00 indicates word line voltage when the "00" state is read, and Vcg01 indicates word line voltage when the "01" state is read. FIG. 16 shows the distributions of the threshold voltages when 2-bit (four-value) data is stored in one memory cell. In this case, "11" indicates the erase state and "10", "00", "01" indicate the program state.

As shown in FIGS. 12A and 12B, when the ratio of the channel width/channel length of P-channel MOS transistors TH, TE is set to 16/2 and the resistance of a load resistor RL is set to 91 kΩ, a current Ie3 flowing through the load resistor RL becomes equal to the sum of a current Ie1 varying in proportion to Ivar and a current Ie2 varying in proportion to Icon (Ie3=Ie1+Ie2). The resistance of a resistor RM in the DC-DC converter (FIG. 12B) which outputs word line voltage Vcg01 is set to 3.3 kΩ and the resistance of a resistor RN is set to 6.7 kΩ.

Figure 13A:
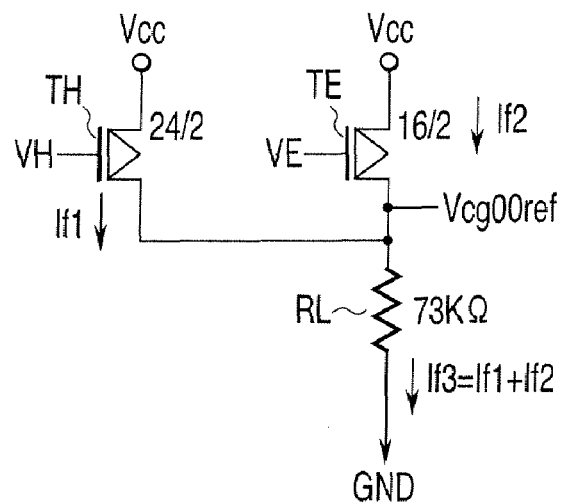
FIG. 13A is a diagram showing a current adding/subtracting circuit which adds/subtracts a constant current which is generated by the circuit of FIG. 11A and is independent of the temperature and a current which is generated by the circuit of FIG. 11B and decreases with the temperature rise to or from each other, for illustrating a case wherein various voltages having the same temperature dependency are generated.
Figure 13B:
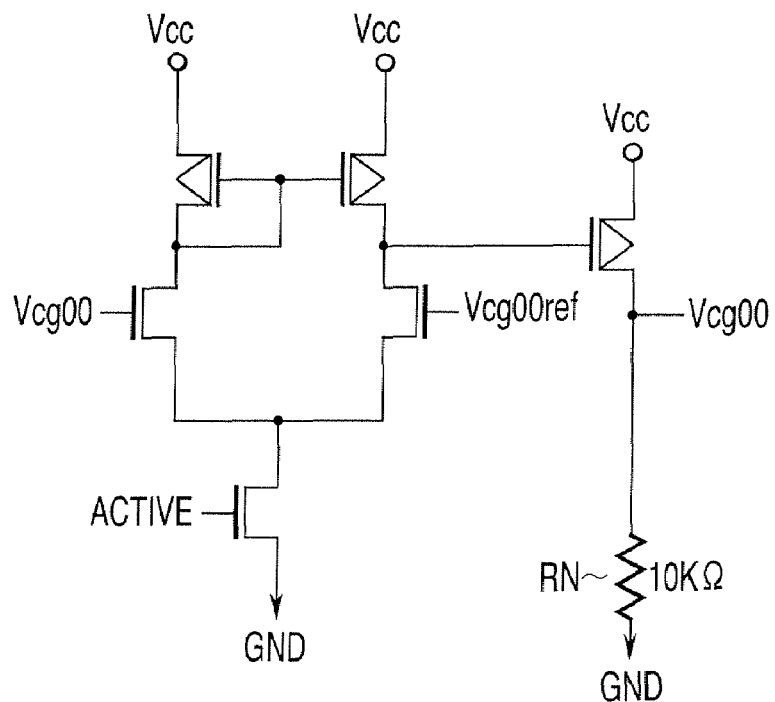
FIG. 13B is a diagram showing a DC-DC converting circuit which adds/subtracts a constant current which is generated by the circuit of FIG. 11A and is independent of the temperature and a current which is generated by the circuit of FIG. 11B and decreases with the temperature rise to or from each other, for illustrating a case wherein various voltages having the same temperature dependency are generated.

As shown in FIGS. 13A and 13B, when the ratio of the channel width/channel length of the P-channel MOS transistor TH is set to 24/2, the ratio of the channel width/channel length of the P-channel MOS transistor TE is set to 16/2 and the resistance of the load resistor RL is set to 73 kΩ, a current If3 flowing through the load resistor RL becomes equal to the sum of a current If1 varying in proportion to Ivar and a current If2 varying in proportion to Icon (If3=If1+If2). In this case, word line voltage Vcg00 is set to Vcg00ref.

Figure 14A:
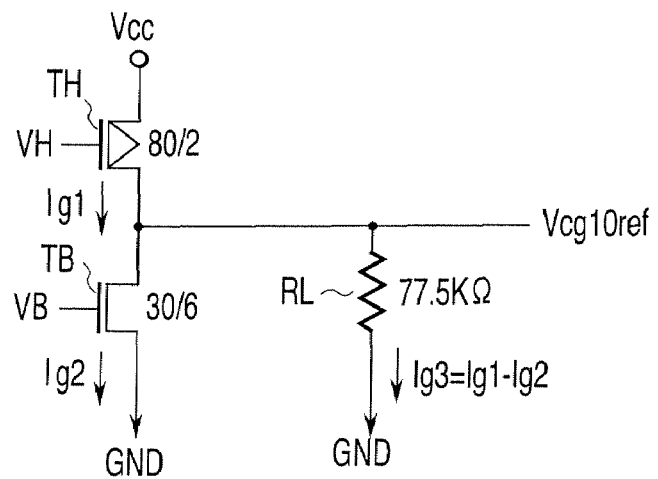
FIG. 14A is a diagram showing a current adding/subtracting circuit which adds/subtracts a constant current which is generated by the circuit of FIG. 11A and is independent of the temperature and a current which is generated by the circuit of FIG. 11B and decreases with the temperature rise to or from each other, for illustrating a case wherein various voltages having the same temperature dependency are generated.
Figure 14B:
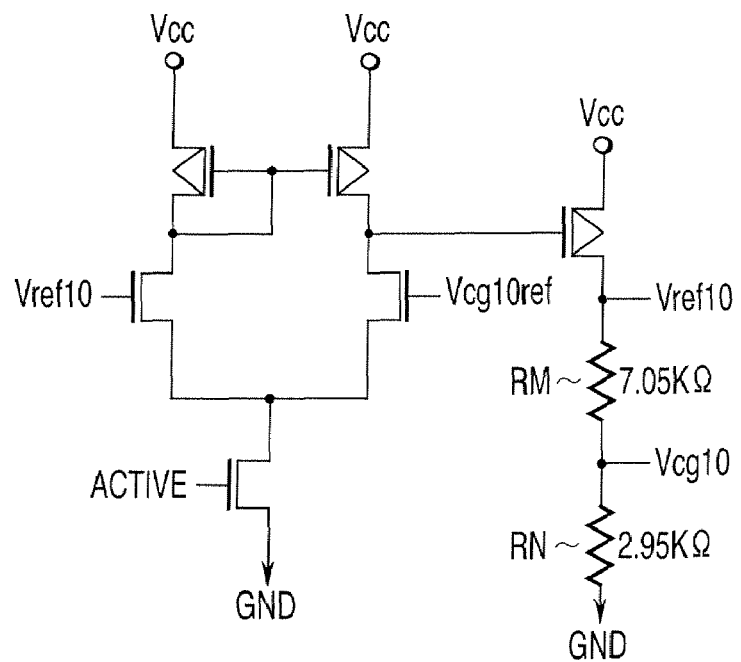
FIG. 14B is a diagram showing a DC-DC converting circuit which adds/subtracts a constant current which is generated by the circuit of FIG. 11A and is independent of the temperature and a current which is generated by the circuit of FIG. 11B and decreases with the temperature rise to or from each other, for illustrating a case wherein various voltages having the same temperature dependency are generated.
Figures 15, 16:
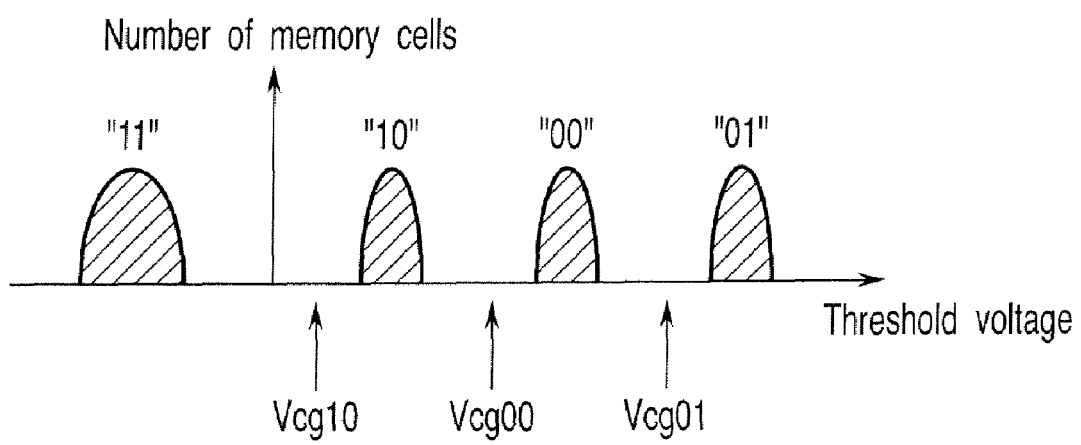
FIG. 15 is a diagram showing the output voltage-temperature characteristic of potentials generated by the circuits shown in FIGS. 12A, 12B to FIGS. 14A, 14B.
FIG. 16 is a diagram for illustrating the relation between the distributions of threshold voltages of four-value memory cells and potentials generated by the circuits shown in FIGS. 12A, 12B to FIGS. 14A, 14B.

Further, as shown in FIGS. 14A and 14B, when the ratio of the channel width/channel length of the P-channel MOS transistor TH is set to 80/2, the ratio of the channel width/channel length of the N-channel MOS transistor TB is set to 30/6 and the resistance of the load resistor RL is set to 77.5 kΩ, a current Ig3 flowing through the load resistor RL becomes equal to a difference between a current Ig1 varying in proportion to Ivar and a current Ig2 varying in proportion to Icon (Ig3=Ig1−Ig2). In this case, the resistance of the resistor RM in the DC-DC converter (FIG. 14B) which outputs word line voltage Vcg10 is set to 7.05 kΩ and the resistance of the resistor RN is set to 2.95 kΩ.

In the circuits shown in FIGS. 12A, 12B to FIGS. 14A, 14B, the output voltages Vcg01ref, Vcg00ref, Vcg10ref of the current adder/subtracter circuits are subjected to the DC-DC conversion to generate potentials Vcg01, Vcg00, Vcg10. The potentials Vcg01, Vcg00, Vcg10 are selectively applied to the word lines of the memory cells.

The output voltages/temperature characteristics of the above potentials Vcg01ref, Vcg00ref, Vcg10ref, Vcg01, Vcg00, Vcg10 are shown in FIG. 15. As is clearly understood from FIG. 15, all of the potentials Vcg01, Vcg00, Vcg10 exhibit the same temperature dependency. Since the temperature dependencies of the threshold voltages of the memory cells are the same in "10", "00", "01", the temperature dependencies of the threshold voltages of the memory cells in all of the states "10", "00", "01" can be compensated for by the voltage generating circuit. In this case, the potentials Vcg01ref, Vcg00ref, Vcg10ref are set in a narrow range of 0.7 to 1.01 V as shown in FIG. 15. That is, in the circuits shown in FIGS. 12A to 14A, since the MOS transistors TH, TE, TB whose gates are supplied with the potentials VH, VE, VB are always set in the saturation region, a stable operation can be attained.

Figure 17:
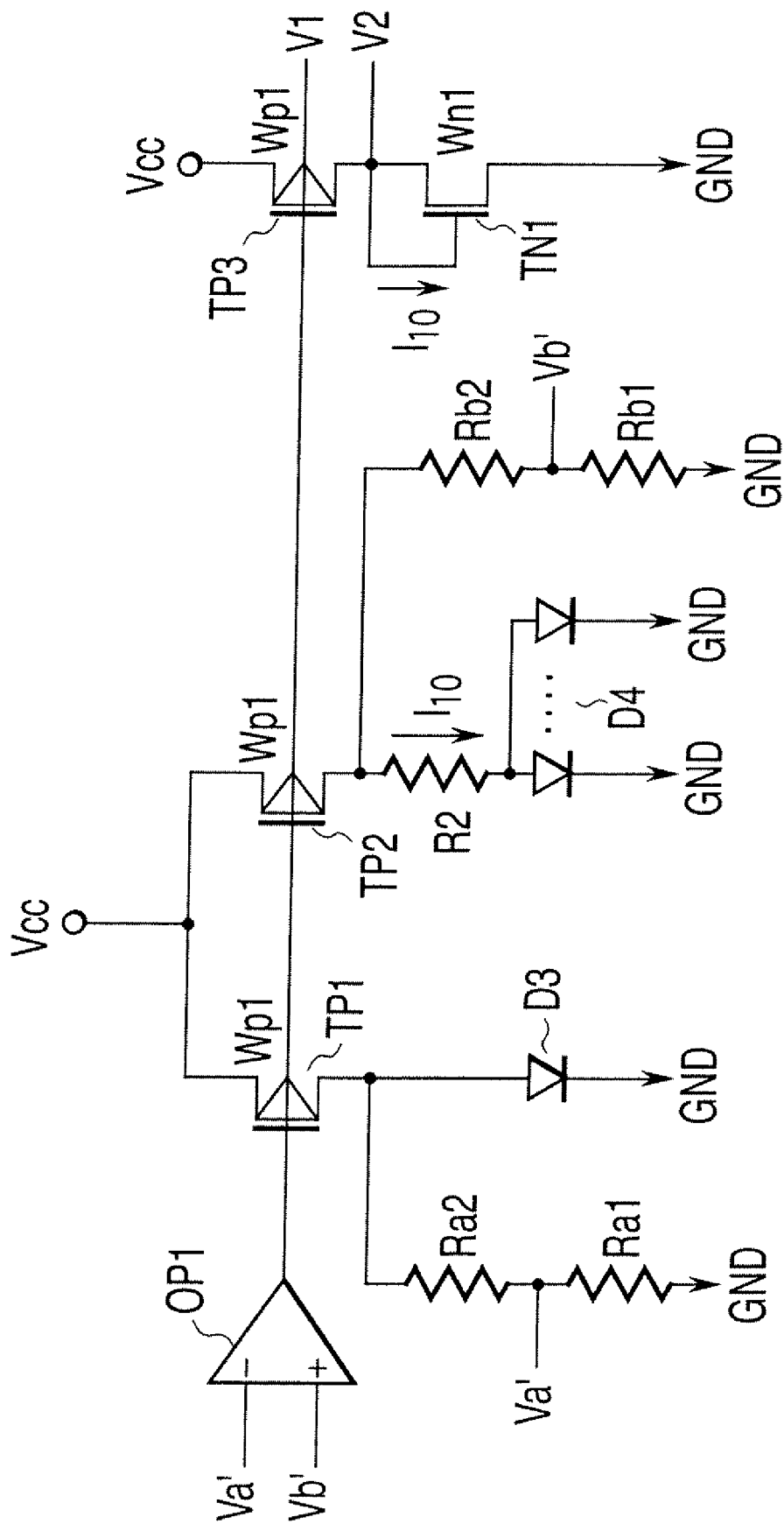
FIG. 17 is a circuit diagram showing another configuration example of the current generating circuit which is shown in FIG. 8A and generates a current which varies in proportion to the temperature.

FIG. 17 shows another configuration example of the current generating circuit which is shown in FIG. 8A and generates a current varying in proportion to the temperature. Further, FIGS. 18A and 18B each show the circuit configuration suitable for the operational amplifier in each of the circuits shown in FIGS. 8A, 8B, 9 and 17.

In the circuit shown in FIG. 17, resistors Ra2, Ra1 are serially connected between the anode of the diode D3 in the circuit shown in FIG. 8A and the ground node GND and potential Va' of a connection node of the resistors Ra2 and Ra1 is supplied to the inverting input terminal (−) of the operational amplifier OP1. Further, resistors Rb2, Rb1 are serially connected between the drain of the MOS transistor TP2 and the ground node GND and potential Vb' of a connection node of the resistors Rb2 and Rb1 is supplied to the non-inverting input terminal (+) of the operational amplifier OP1. That is, input potentials to the operational amplifier OP1 are lowered by resistive potential division.

Figure 18A:
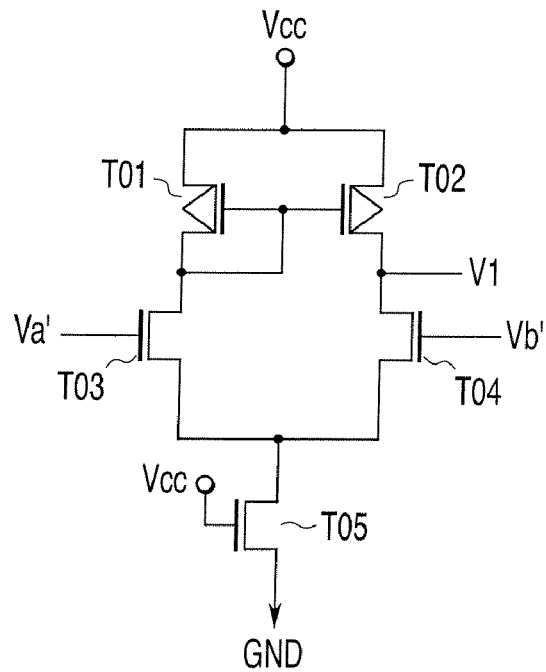
FIG. 18A is a circuit diagram showing a first example of the circuit configuration suitable for an operational amplifier in the circuits shown in FIGS. 8A, 8B, 9 and 17.
Figure 18B:
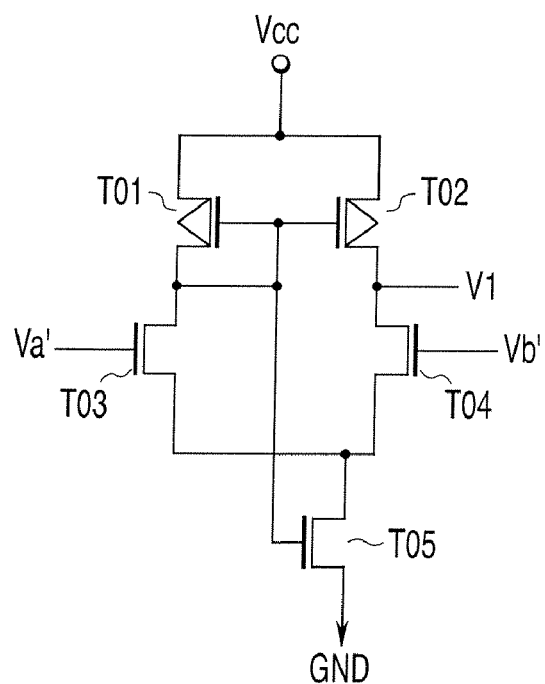
FIG. 18B is a circuit diagram showing a second example of the circuit configuration suitable for the operational amplifier in the circuits shown in FIGS. 8A, 8B, 9 and 17.

As shown in FIGS. 18A and 18B, the operational amplifier OP1 includes P-channel MOS transistors TO1, TO2 and N-channel MOS transistors TO3 to TO5 and functions as a differential amplifier. The input potentials Va', Vb' are respectively supplied to the gates of the MOS transistors TO3, TO4 and a differential amplification signal (potential V1) is output from a common connection node of the drains of the MOS transistors TO2 and TO4.

In FIG. 17, if the relation of the ratios of the resistances of the added resistors is set to Ra2/Ra1=Rb2/Rb1, VA=VB when VA'=VB'. In this case, since the input potentials of the operational amplifier OP1 can be lowered, the sensitivity thereof can be enhanced when the operation amplifier OP1 has the circuit configuration as shown in FIGS. 18A and 18B, for example.

FIG. 19 shows a modification of the voltage generating circuit explained above and shows an amplifier circuit which amplifies and outputs the output voltage Voutput of the circuit shown in FIG. 10. In the case of the circuit configurations shown in FIG. 7 and FIGS. 11A, 11B to 14A, 14B, Vcg01, Vcg00, Vcg10 are input to Voutput of FIGS. 19 and 20. The circuit is configured by an operation amplifier OP3 and P-channel MOS transistor TR. The output voltage Voutput is supplied to the inverting input terminal (−) of the operational amplifier OP3 and the output terminal thereof is connected to the gate of the MOS transistor TR. The source of the MOS transistor TR is connected to the power supply node Vcc and the drain thereof is connected to the non-inverting input terminal (+) of the operational amplifier OP3. Output voltage Vout1 which is the same as Voutput is output from the drain of the MOS transistor TR.

By thus providing the amplifier circuit, the current supply ability can be enhanced.

When the output voltage Voutput higher than the power supply voltage Vcc is required, the output voltage of the operational amplifier OP3 shown in FIG. 20 may be raised. That is, an output signal VXXFLAG of the operational amplifier OP3 is supplied to a booster control circuit 202 and an output of the booster control circuit 202 is supplied to control a booster circuit 201. Resistors Rs1 and Rs2 are serially connected between the output terminal of the booster circuit 201 and the ground node GND and a connection node of the resistors is connected to the non-inverting input terminal (+) of the operational amplifier OP3. Thus, the output voltage Voutput higher than the power supply voltage Vcc is output from the output terminal of the booster circuit 201.

Figure 21:
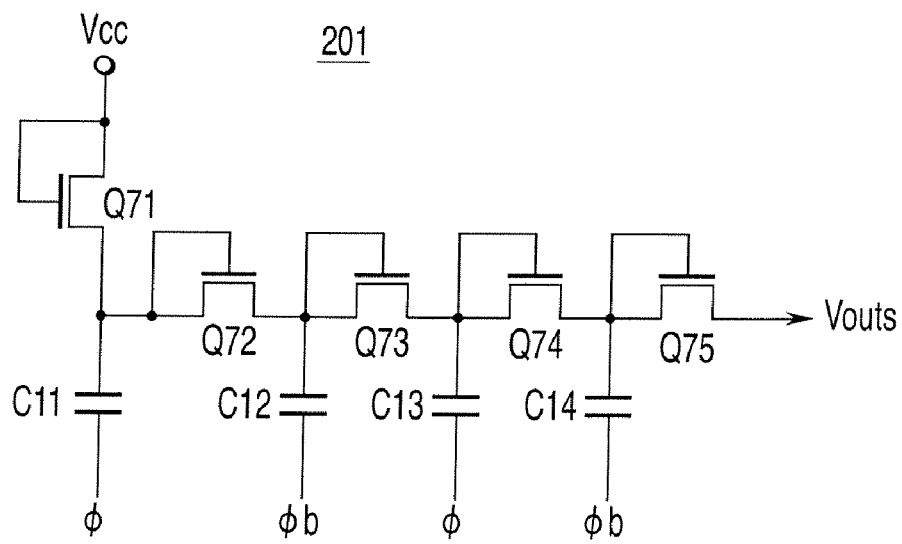
FIG. 21 is a circuit diagram showing a configuration example of a booster circuit in the circuit shown in FIG. 20.

For example, as shown in FIG. 21, the booster circuit 201 includes N-channel MOS transistors Q71 to Q75 serially connected between the power supply terminal to which the power supply voltage Vcc is applied and an output terminal and pumping capacitors C11 to C14 having one-side electrodes respectively connected to the connection nodes of the MOS transistors. A clock signal φ is supplied to the other electrodes of the odd-numbered capacitors C11, C13 and a clock signal φb which is complementary to the clock signal φ is supplied to the other electrodes of the even-numbered capacitors C12, C14. Thus, the charge storage operation of each capacitor and the charge transfer operation in one direction are repeatedly performed to attain boosted output voltage Vouts higher than the power supply voltage Vcc.

Figure 22:
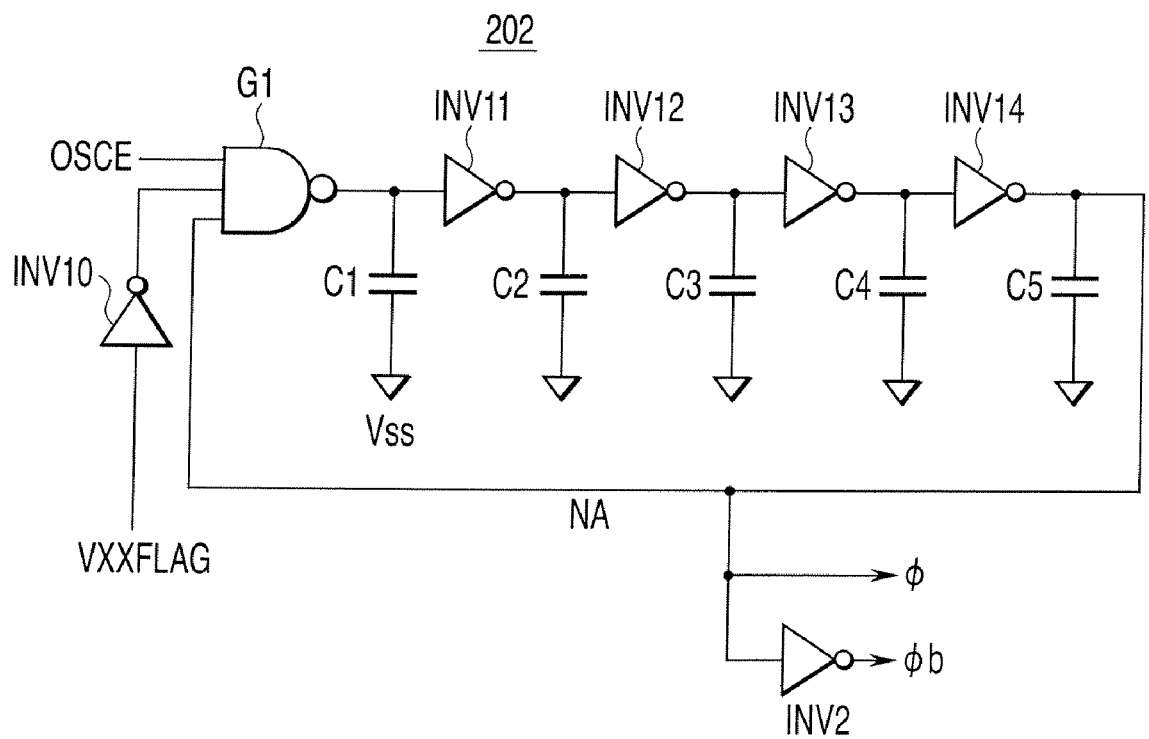
FIG. 22 is a circuit diagram showing a configuration example of a booster control circuit in the circuit shown in FIG. 20.

The booster control circuit 202 generates the complementary signals φ, φb and includes a ring oscillator configured by a NAND gate G1, inverters INV10 to INV14 and capacitors C1 to C5 as shown in FIG. 22, for example. An oscillation enable signal OSCE is input to the first input terminal of the NAND gate G1 and permits oscillation when the oscillation signal OSCE is set high. The output signal VXXFLAG of the operational amplifier OP3 shown in FIG. 20 is supplied to the second input terminal of the NAND gate G1 via the inverter INV10. The signal VXXFLAG is normally set low and is used as a control signal which activates or deactivates the boosting operation. An output signal of the inverter INV14 is fed back to the third input terminal of the NAND gate G1.

The signal VXXFLAG is set low and the booster circuit 201 continuously performs the boosting operation until the output voltage Vouts reaches a value expressed by the following equation in the circuit of FIG. 20.

$$Vouts=[(Rs1+Rs2)/Rs2] \times Voutput$$

Then, when the output voltage Vouts reaches the above value, the signal VXXFLAG is set high and the boosting operation is terminated.

Thus, the output voltage Vouts is set to the value expressed by the above equation. As described above, since the output voltage Voutput can be set to exhibit various temperature dependencies, the voltage Vouts obtained by raising the voltage may also exhibit various temperature dependencies.

Figure 23:
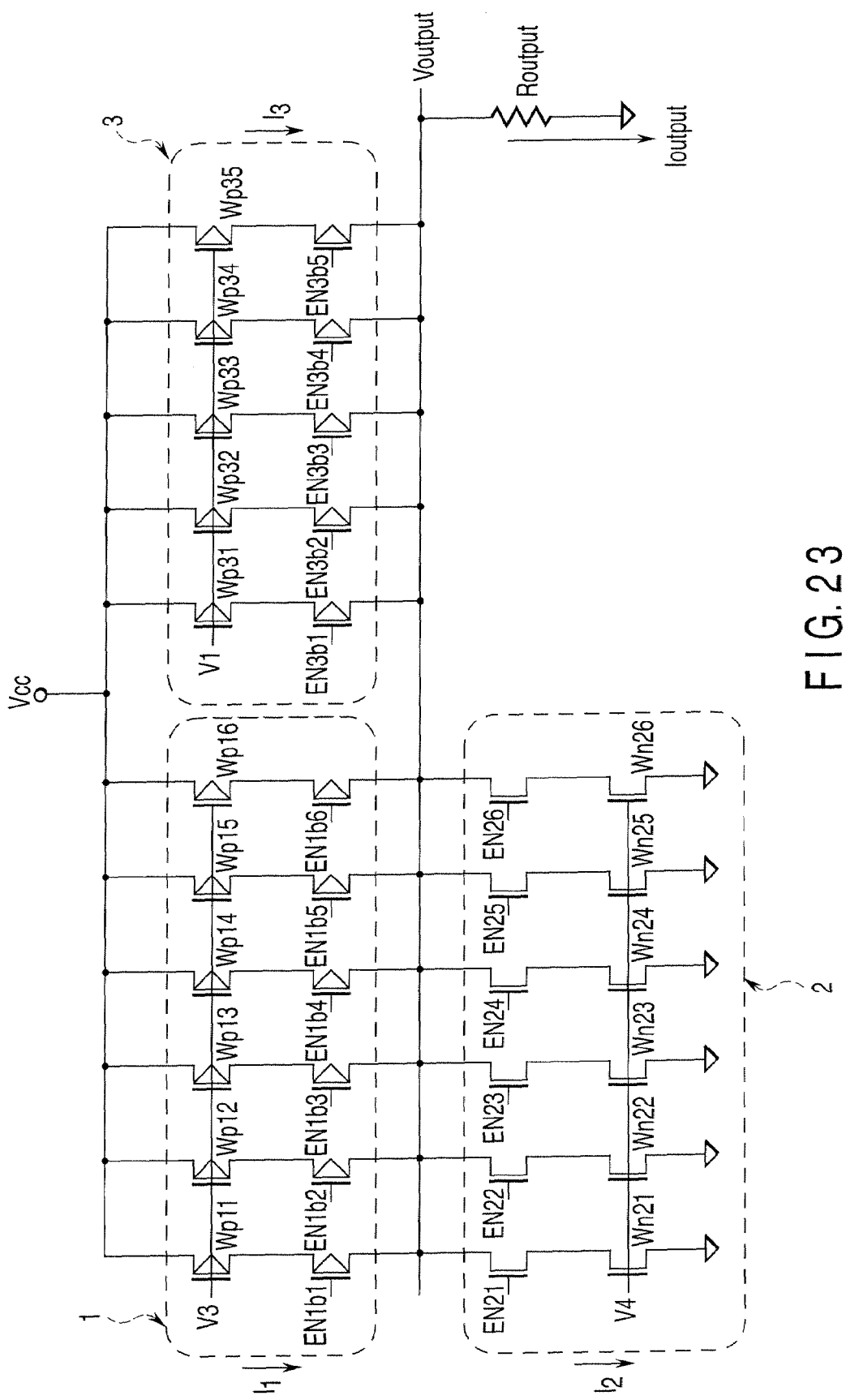
FIG. 23 is a circuit diagram showing a modification of the voltage generating circuit shown in FIG. 10.

The voltage generating circuit can be variously modified. For example, as shown in FIG. 23, if the current source 4 in the circuit of FIG. 10 is omitted and the current sources 1, 2, 3 are provided, a voltage generating circuit which has various voltage values and exhibits various positive temperature characteristics as explained before can be attained. Further, as explained in the item (1), only the current sources 1 and 3 or only the current sources 3 and 2 are provided, a voltage generating circuit which has various voltage values and exhibits various positive temperature characteristics can be attained.

Figure 24:
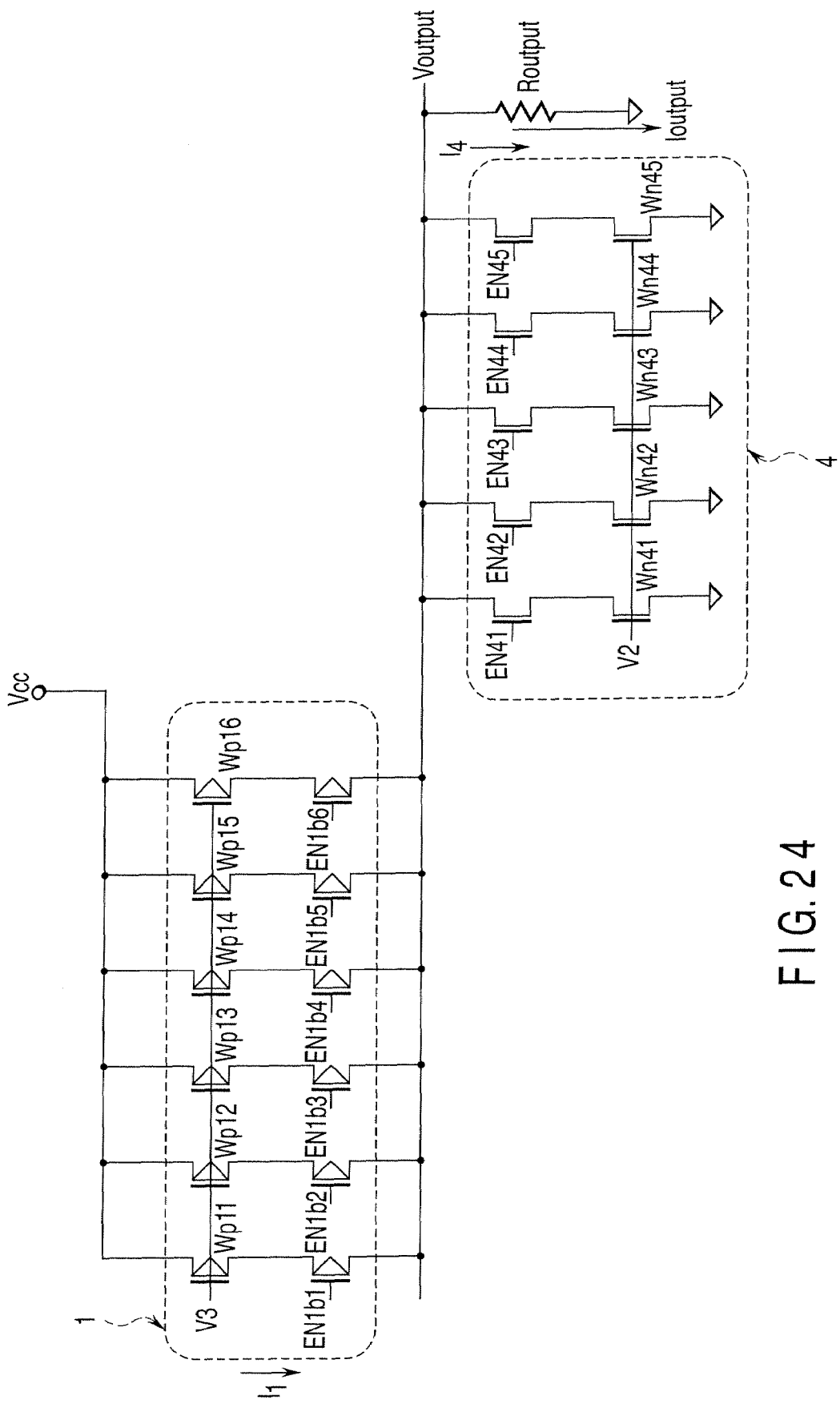
FIG. 24 is a circuit diagram showing another modification of the voltage generating circuit shown in FIG. 10.

Further, as shown in FIG. 24, if the current sources 1, 4 are provided, a voltage generating circuit which has various voltage values and exhibits various negative temperature characteristics can be attained.

Figure 25:
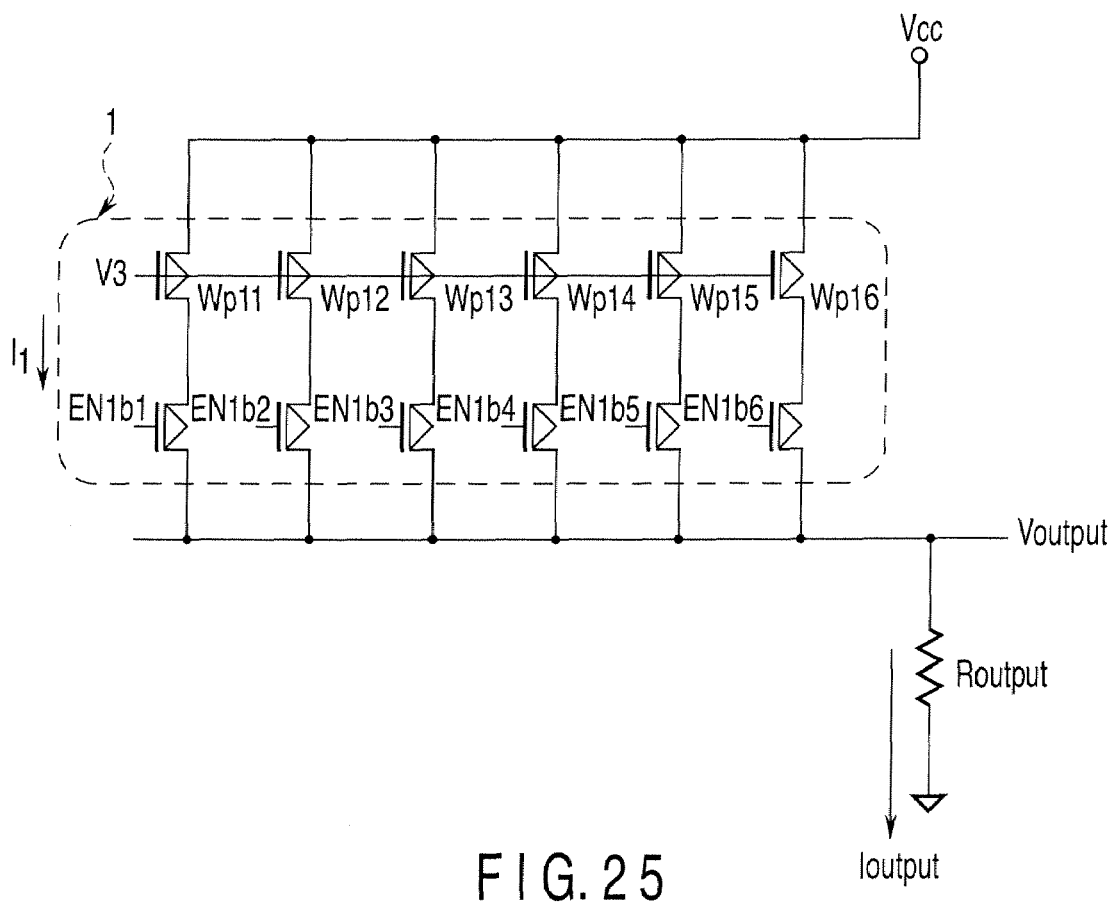
FIG. 25 is a circuit diagram showing still another modification of the voltage generating circuit shown in FIG. 10.

In addition, if only the current source 1 is provided as shown in FIG. 25, a voltage generating circuit which has various voltage values and is independent of the temperature can be attained.

As described above, in the circuit shown in FIG. 10, the absolute value of the output voltage Voutput can be adjusted by changing the total sum of the channel widths of the MOS transistors which are set in the on state in each current source. For example, when the output voltage Voutput fluctuates due to a variation in the resistances of the resistor elements for each chip, high/low the enable signals ENb1, ENb2, ..., EN1b5, EN1b6 and enable signals EN21, EN22, ..., EN25, EN26 and the like may be switched based on information stored in the memory circuit 34 or a signal or command input from the exterior, for example, to adjust the value of the output voltage Voutput.

Further, the temperature dependency of the output voltage Voutput can be adjusted by changing the total sum of the channel widths of the MOS transistors which are set in the on state in each current source. For example, when it is required to adjust the temperature dependency of the output voltage Voutput for each chip since a current (cell current) of the memory cell at the read time varies for each chip, high/low the enable signals EN3b1, EN3b2, ..., EN3b5, EN3b6 and enable signals EN41, EN42, ..., EN45 may be switched based on information stored in the memory circuit 34 or a signal or command input from the exterior, for example, to adjust the temperature dependency of the output voltage Voutput.

It is of course possible to provide the configurations shown in FIGS. 19 and 20 at the output terminals of the circuits shown in FIGS. 23 to 25.

With the above configuration, in the voltage generating circuit, the three characteristics, that is, the positive temperature characteristic, the negative characteristic and the characteristic free from temperature dependency can be selectively switched according to the enable signals EN1b, EN2, EN3b, EN4. Thus, the above characteristics can be selectively used as required.

A combination of the positive temperature characteristic, the negative characteristic and the characteristic free from temperature dependency is basically determined to compensate for the temperature dependency of the memory cell and information thereof is stored in the memory circuit 34.

The positive temperature characteristic, the negative characteristic and the characteristic free from temperature dependency are not limited to the case explained above and various configurations can be applied. For example, the output currents $I_1$, $I_2$, $I_3$, $I_4$ of the current sources 1, 2, 3, 4 in the circuit shown in FIG. 7 may be changed. Therefore, the dimensions (channel length/channel width ratios, particularly, channel widths) of the MOS transistors TP1, TP2, TP3, TN1, TP4, TP5, TN2 in the circuits shown in FIGS. 8A and 8B can be made variable and the resistors R2, R3 can be formed of variable resistors, for example. Of course, the channel widths of the MOS transistors TP1, TP2, TP3, TN1, TP4, TP5, TN2 can be made variable and the resistors R2, R3 can be formed of variable resistors.

Figure 26:
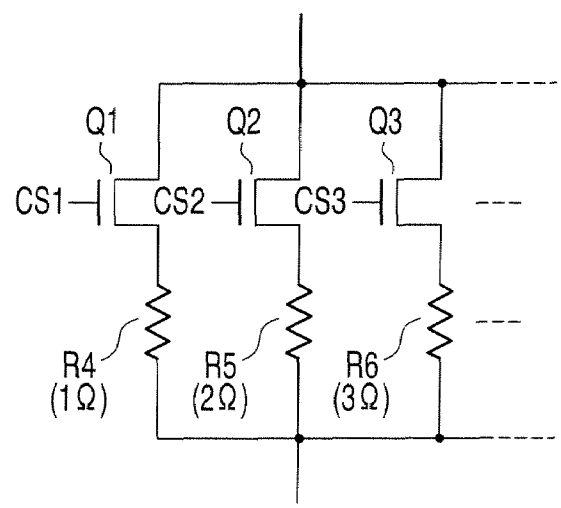
FIG. 26 is a circuit diagram showing a configuration example of a variable resistor.

For example, as shown in FIG. 26, the variable resistor can be configured by resistors R4, R5, R6, ..., having different resistances and MOS transistors Q1, Q2, Q3, ... functioning as switches. In FIG. 26, the resistances of the resistors R4, R5, R6, ... are set to 1Ω, 2Ω, 3Ω, ... and the MOS transistors Q1, Q2, Q3, ... are ON/OFF-controlled by control signals CS1, CS2, CS3, .... Thus, the resistors R4, R5, R6, ... are selectively connected in parallel to change the resistance value.

Further, the temperature characteristic can be changed by changing the resistances of the resistors R1 to R4 used in the band gap reference circuit shown in FIG. 9 to upset the balance which causes the characteristic to be free from temperature dependency.

Second Embodiment

FIG. 27 shows the drain current Id-gate voltage Vg characteristic of a memory cell transistor. The temperature characteristics are different depending on the value of the drain current Id used to perform the sense operation. The value of the drain current Id used to perform the sense operation at the read time is determined by the read time and array noise.

Specifically, the temperature characteristic is controlled as shown in the following items (1) to (3).

(1) In case of setting positive temperature characteristic for Vg:

When the bit line capacitance is set to CB, time required for discharging the bit line by use of a cell current is set to TBL and the amplitude of potential of the bit line required for reading out data is set to $\Delta V$, the drain current Id required for reading out data from the memory cell is expressed by the following equation.

$$Id = CBL \times \Delta V/TBL$$

Therefore, when the read time is reduced (when TBL is short), the drain current Id used for the sense operation becomes large. A region A1 in FIG. 27 indicates a case wherein the drain current Id used for the sense operation is large. In the region A1, the current is larger at low temperatures than at high temperatures with respect to the same gate voltage Vg. In this example, in order to attain the constant drain current Id1 irrespective of the temperature, the control gate voltage of the selected memory cell is controlled to become higher at a high temperature (Vga) than at a low temperature (Vgb) in the read verify read mode.

(2) In case of setting negative temperature characteristic for Vg:

If the read time is set long, the drain current Id required for the read operation becomes smaller since TBL is long and a region A3 in FIG. 27 is obtained. By setting the read time long, array noise in the memory cell array can be made small and the width of the distribution of threshold voltages can be narrowed. In the region A3, the current is larger at high temperatures than at low temperatures with respect to the same gate voltage Vg. In this example, in order to attain the constant drain current Id1 irrespective of the temperature, the control gate voltage Vg of the selected memory cell is controlled to become lower at a high temperature (Vge) than at a low temperature (Vgd) in the read verify read mode.

(3) In case of eliminating temperature dependency of Vg:

In a region A2 of FIG. 27, that is, when the current used for the sense operation is Id, the current does not depend on the temperature with respect to the control gate voltage Vgc. In this case, the control gate voltage of the selected memory cell is set constant irrespective of the temperature in the read verify read mode.

As described above, a variation in the memory cell current caused by the temperature variation with respect to various read times can always be eliminated by using a voltage generating circuit which can variously adjust both of the positive and negative temperature characteristics and generating the control gate voltage from the voltage generating circuit in the read verify read mode. Further, the width of the is distribution of the threshold voltages can be narrowed by eliminating the temperature dependency of the read current.

Third Embodiment

A nonvolatile semiconductor memory device according to one embodiment of this invention is more effective in a multi-value memory having distributions of threshold voltages as shown in FIG. 28. FIG. 28 shows the distributions of the threshold voltages of four-value memory cells. The operation of the multi-value memory is substantially the same as that of the binary memory. For example, in the read operation, when "11" is read or when "10", "01", "00" is read, voltage Vrd1 (for example, 0.05 V or 0 V) is applied to the selected control gate and whether a current flows in the memory cell or not is checked. When "11", "10" is read or when "01", "00" is read, voltage Vrd2 (for example, 0.7 V) is applied to the selected control gate and whether a current flows in the memory cell or not is checked. When "11", "10", "01" is read or when "00" is read, voltage Vrd3 (for example, 1.45 V) is applied to the selected control gate and whether a current flows in the memory cell or not is checked.

Further, in the "10" verify read operation, the selected control gate is set to Vvfy1 (for example, 0.15 V). In the "01" verify read operation, the selected control gate is set to Vvfy2 (for example, 0.9 V). In the "00" verify read operation, the selected control gate is set to Vvfy3 (for example, 1.75 V).

In this example, various voltages which vary with the temperature in the same manner can be generated by changing the current $I_1$ or $I_2$ which is independent of the temperature while the current $I_3$ or $I_4$ which depends on the temperature as shown in FIG. 7 is kept constant. That is, the voltages Vrd1, Vrd2, Vrd3, Vvfy1, Vvfy2, Vvfy3 having the same temperature dependency can be generated by changing the current $I_1$ or $I_2$ by use of the circuit shown in FIG. 7. Alternatively, the temperature dependencies of the voltages Vrd1, Vrd2, Vrd3, Vvfy1, Vvfy2, Vvfy3 can be adjusted in the same manner by adjusting the currents $I_3$, $I_4$.

In the NAND cell type EEPROM, voltage Vread higher than the program threshold voltage as shown in FIGS. 5 and 27 is applied to the control gate lines and selection gate lines which are connected to non-selected memory cells serially connected to a selected memory cell in the read verify read mode. Like the voltages Vrd1, Vvfy1, the voltage Vread can also be set to have the temperature dependency by use of the circuit shown in FIG. 7. Thus, since the temperature dependency of the resistances of the selection transistors and non-selected memory cells can be eliminated in the read verify read mode, the highly precise read operation can be performed and the narrow width of the distribution of threshold voltages can be attained.

With the above configuration, the positive temperature characteristic, the negative temperature characteristic and the characteristic having no temperature dependency can be selectively used as required.

The above constant current generating circuit can be variously modified. For example, the channel widths of the MOS transistors TP1, TP2, TP3, TN1, TP4, TP5, TN2 in the circuits shown in FIGS. 8A and 8B can be made variable. In this case, since the current $I_{10}$ or $I_{20}$ in FIG. 8A or 8B can be changed, the current of the current source in FIG. 10 can be changed and the temperature dependency and the value of the output voltage Voutput of FIG. 10 can be variously changed. Of course, the channel widths of the MOS transistors TP1, TP2, TP3, TN1, TP4, TP5, TN2 of FIGS. 8A and 8B can be made variable according to information stored in the memory circuit 34 or a signal or command input from the exterior. The total sum of the channel widths of the transistors of the current source of FIG. 10 can be made variable according to information stored in the memory circuit 34 or a signal or command input from the exterior.

A case wherein the voltage sensing type sense amplifier is used is explained as an example. However, the sense amplifier is not limited to the voltage sensing type and a sense amplifier of another type can be applied. For example, a current sensing type sense amplifier can be used and if the current sensing type sense amplifier is used in a nonvolatile semiconductor memory device having copper (Cu) wires of 70 nm generation or 55 nm generation in which the sheet resistance becomes extremely high, a significant effect can be attained.

In the above embodiments, the NAND cell type EEPROM is explained as an example. However, this invention can be applied to a flash memory of any type such as a NOR type, AND type (A. Zozoe: ISSCC, Digest of Technical Papers, 1995), DINOR type (S. Kobayashi: ISSCC, Digest of Technical Papers, 1995), Virtual Ground Array type (Lee. et al: Symposium on VLSI Circuits, Digest of Technical Papers, 1994) or the like. Further, this invention is not limited to a flash memory but can be applied to a mask ROM, EPROM. That is, in the above devices other than the flash memory, the precise read operation can be performed and the narrow width of the distribution of threshold voltages can be attained by setting the word line voltage to have the temperature dependency in the read verify read mode.

Further, this invention can be applied not only to the semiconductor memory device but also to an system-on-chip (SoC) or a hybrid chip having a memory circuit and logic circuit mounted thereon.

As described above, according to one aspect of this invention, a nonvolatile semiconductor memory device and data read method in which spreading of the distribution of threshold voltages of memory cells due to a temperature variation can be suppressed and the data holding characteristic can be improved can be attained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
    a memory cell array having memory cells arranged in a matrix form,
    a read circuit configured to read data from a memory cell in the memory cell array,
    a program circuit configured to program data into the memory cell in the memory cell array,
    a read voltage generating circuit configured to generate and supply a read voltage to the read circuit, the read voltage generating circuit including a first constant current source which is connected to an output terminal and supplies a first constant current substantially independent of a temperature variation to the output terminal or discharges the first constant current from the output terminal, a first temperature-dependent current source which is connected to the output terminal and supplies a first temperature-dependent current depending on a temperature variation to the output terminal or discharges the temperature-dependent current from the output terminal, and a current/voltage converter connected to the output terminal,
    a memory circuit configured to store information used to change a temperature characteristic of the memory cell in the memory cell array, and
    a switching circuit configured to switch temperature dependency of the read voltage generated by the read voltage generating circuit based on information stored in the memory circuit.

2. The nonvolatile semiconductor memory device according to claim 1, wherein the memory cell array has NAND cells arranged in a matrix form.

3. The nonvolatile semiconductor memory device according to claim 1, wherein the read circuit includes an address buffer which is supplied with an address signal, a row decoder which decodes a row address signal supplied from the address buffer to select one of word lines, a control gate driver which is supplied with read voltage output from the read voltage generating circuit and selectively transfers the read voltage to the word line in the memory cell array via the row decoder, a column decoder which decodes a column address signal supplied from the address buffer to select one of bit lines, a data circuit which temporarily stores program data and read data, an I/O sense amplifier which senses and amplifies data, and a data input/output buffer which inputs/outputs data.

4. The nonvolatile semiconductor memory device according to claim 1, wherein the program circuit includes an address buffer which is supplied with an address signal, a row decoder which decodes a row address signal supplied from the address buffer to select one of word lines, a column decoder which decodes a column address signal supplied from the address buffer to select one of bit lines, a data circuit which temporarily stores program data and read data, an I/O sense amplifier which senses and amplifies data, and a data input/output buffer which inputs/outputs data.

5. The nonvolatile semiconductor memory device according to claim 1, wherein the read voltage generating circuit further includes a second constant current source which is connected to the output terminal and discharges a second constant current substantially independent of a temperature variation from the output terminal, and a second temperature-dependent current source which is connected to the output terminal and discharges a second temperature-dependent current depending on a temperature variation from the output terminal,
    the first constant current source supplies the first constant current to the output terminal, and
    the first temperature-dependent current source supplies the first temperature-dependent current to the output terminal.

6. The nonvolatile semiconductor memory device according to claim 1, wherein the memory circuit includes fuse elements in which information is previously programmed.

7. The nonvolatile semiconductor memory device according to claim 1, wherein the memory circuit includes ROM fuses in which information can be rewritten from an exterior.

8. The nonvolatile semiconductor memory device according to claim 1, wherein the memory circuit is part of a memory area in the memory cell array.

9. The nonvolatile semiconductor memory device according to claim 1, wherein the memory circuit further stores information corresponding to a distance of a memory cell in the memory cell array from a sense point, and the switching circuit switches the temperature dependency of read voltage output from the read voltage generating circuit based on information used to change the temperature characteristic of the memory cell in the memory cell array and information corresponding to a distance of a memory cell which is subjected to a read operation from a sense point.

10. The nonvolatile semiconductor memory device according to claim 1, wherein the memory circuit further stores information corresponding to one of a plane and block address in the memory cell array and the switching circuit changes the temperature dependency of read voltage output from the read voltage generating circuit based on information used to change the temperature characteristic of a memory cell in the memory cell array and one of the plane and block address of a memory cell which is subjected to a read operation.

11. The nonvolatile semiconductor memory device according to claim 1, wherein the memory circuit further stores information used to identify one of a plurality of groups having different temperature dependencies obtained by dividing the memory cells of the memory cell array to which an accessed memory cell belongs, and the switching circuit changes the temperature dependency of read voltage output from the read voltage generating circuit based on information used to change the temperature characteristic of the memory cell in the memory cell array and information used to identify one of the plurality of groups to which a memory cell which is subjected to a read operation belongs.

12. The nonvolatile semiconductor memory device according to claim 1, wherein the memory circuit further stores information indicating a position of a wafer in which a chip of the nonvolatile semiconductor memory device is formed and the switching circuit changes the temperature dependency of read voltage output from the read voltage generating circuit based on information used to change the temperature characteristic of the memory cell in the memory cell array and information indicating the position of the wafer in which the chip of the nonvolatile semiconductor memory device is formed.

13. The nonvolatile semiconductor memory device according to claim 1, wherein the switching circuit changes the temperature characteristic of the memory cell by changing the temperature dependency of read voltage output from the read voltage generating circuit and supplied to a selected word line in a read verify read mode.

14. A data read method of a nonvolatile semiconductor memory device comprising:
    storing information used to change a temperature characteristic of a memory cell in a memory cell array,
    setting read voltage based on the stored information used to change the temperature characteristic when a memory cell which is subjected to a read operation is accessed, and
    changing the temperature characteristic of threshold voltage of the memory cell based on the set read voltage to read data.

15. The data read method of the nonvolatile semiconductor memory device according to claim 14, wherein the storing the information is programming data in fuse elements.

16. The data read method of the nonvolatile semiconductor memory device according to claim 14, wherein the storing the information is programming data in ROM fuses.

17. The data read method of the nonvolatile semiconductor memory device according to claim 14, wherein the information used to change the temperature characteristic is information corresponding to a distance from a sense point to the memory cell which is subjected to a read operation, and the setting the read voltage includes changing the read voltage according to the distance from the sense point to the memory cell which is subjected to the read operation.

18. The data read method of the nonvolatile semiconductor memory device according to claim 14, wherein the information used to change the temperature characteristic contains at least one of a plane, block address and column address of a memory cell which is subjected to the read operation, and the setting the read voltage includes changing the read voltage based on at least one of the plane, block address and column address of the memory cell which is subjected to the read operation.

19. The data read method of the nonvolatile semiconductor memory device according to claim 14, wherein the information used to change the temperature characteristic includes information indicating one of a plurality of groups having different temperature dependencies to which the memory cell in the memory cell array belongs, and the setting the read voltage includes changing the read voltage based on one of the groups to which an accessed memory cell belongs.

20. The data read method of the nonvolatile semiconductor memory device according to claim 14, wherein the information used to change the temperature characteristic contains information indicating a position of a wafer in which a chip of the nonvolatile semiconductor memory device is formed, and the setting the read voltage includes changing the read voltage based on the position of the wafer in which the chip of the nonvolatile semiconductor memory device is formed.

21. The data read method of the nonvolatile semiconductor memory device according to claim 14, wherein the changing the temperature characteristic of the threshold voltage to read data includes changing a temperature characteristic of word line voltage in a program verify read mode.

22. A nonvolatile semiconductor memory device comprising:
    a memory cell array having memory cells arranged in a matrix form,
    a read circuit configured to read data from a memory cell in the memory cell array,
    a program circuit configured to program data into the memory cell in the memory cell array,
    a read voltage generating circuit configured to generate and supply a read voltage to the read circuit,
    a memory circuit configured to store information used to change a temperature characteristic of the memory cell in the memory cell array, and store information corresponding to one of a plane and block address in the memory cell array, and
    a switching circuit configured to switch temperature dependency of read voltage generated by the read voltage generating circuit based on information stored in the memory circuit, and change the temperature dependency of read voltage output from the read voltage generating circuit based on the information used to change the temperature characteristic of a memory cell in the memory cell array and one of the plane and block address of a memory cell which is subjected to a read operation.

* * * * *